(12) United States Patent
Wu et al.

(10) Patent No.: US 8,598,299 B2
(45) Date of Patent: Dec. 3, 2013

(54) SEMICONDUCTOR COMPOSITION

(75) Inventors: Yiliang Wu, Oakville (CA); Anthony James Wigglesworth, Oakville (CA); Ping Liu, Mississauga (CA)

(73) Assignee: Xerox Corporation, Norwalk, CT (US)

( * ) Notice: Subject to any disclaimer, the term of this patent is extended or adjusted under 35 U.S.C. 154(b) by 0 days.

(21) Appl. No.: 13/312,315

(22) Filed: Dec. 6, 2011

(65) Prior Publication Data

US 2013/0140494 A1 Jun. 6, 2013

(51) Int. Cl.
*C08G 14/10* (2006.01)

(52) U.S. Cl.
USPC ............. 528/163; 528/216; 528/117; 528/54; 528/94; 528/377; 257/40

(58) Field of Classification Search
USPC ............. 528/163, 216, 117, 54, 94, 377, 380; 257/40
See application file for complete search history.

(56) References Cited

U.S. PATENT DOCUMENTS

| 7,910,684 | B2 | 3/2011 | Li |
| 7,932,344 | B2 | 4/2011 | Li |
| 2009/0302311 | A1* | 12/2009 | Turbiez et al. .................. 257/40 |
| 2010/0041861 | A1 | 2/2010 | Li |

FOREIGN PATENT DOCUMENTS

| WO | WO 2005/049695 A1 | 6/2005 |
| WO | WO 2011/025455 A1 | 3/2011 |

OTHER PUBLICATIONS

U.S. Appl. No. 13/037,466, filed Mar. 1, 2011; Title: Dithioketopyrrolopyrrole-Based Polymers; Inventors: Yiliang Wu et al.

* cited by examiner

*Primary Examiner* — Shane Fang
(74) *Attorney, Agent, or Firm* — Fay Sharpe LLP

(57) ABSTRACT

A semiconductor composition for producing a semiconducting layer with consistently high mobility is disclosed. The semiconductor composition includes a diketopyrrolopyrrole-thiophene copolymer and a non-aromatic halogenated hydrocarbon solvent. The copolymer has a structure disclosed within. Preferably, the non-aromatic halogenated hydrocarbon solvent contains at least 2 carbon atoms and at least 3 halogen atoms.

10 Claims, 5 Drawing Sheets

SEMICONDUCTOR COMPOSITION

BACKGROUND

The present disclosure relates to thin-film transistors (TFTs) and/or other electronic devices comprising a semiconducting layer. The semiconducting layer is formed from a semiconductor composition as described herein. When the composition is used in the semiconducting layer of a device, high mobility and excellent stability may be achieved.

TFTs are generally composed of, on a substrate, an electrically conductive gate electrode, source and drain electrodes, an electrically insulating gate dielectric layer which separate the gate electrode from the source and drain electrodes, and a semiconducting layer which is in contact with the gate dielectric layer and bridges the source and drain electrodes. Their performance can be determined by the field effect mobility and the current on/off ratio of the overall transistor. High mobility and high on/off ratio are desired.

Organic thin-film transistors (OTFTs) can be used in applications such as radio frequency identification (RFID) tags and backplane switching circuits for displays, such as signage, readers, and liquid crystal displays, where high switching speeds and/or high density are not essential. They also have attractive mechanical properties such as being physically compact, lightweight, and flexible.

Organic thin-film transistors can be fabricated using low-cost solution-based patterning and deposition techniques, such as spin coating, solution casting, dip coating, stencil/screen printing, flexography, gravure, offset printing, ink jet-printing, micro-contact printing, and the like. To enable the use of these solution-based processes in fabricating thin-film transistor circuits, solution processable materials are therefore required. However, most current organic or polymeric semiconductors formed by solution processing tend to suffer from limited solubility, air sensitivity, and especially low field-effect mobility. Some poor performance, such as low field-effect mobility, may be attributable to the poor semiconductor film formed from an improper semiconductor composition.

It would be desirable to develop semiconductor compositions that can be used to form semiconducting layers that exhibit high field effect mobility, air stability, and good solubility.

BRIEF DESCRIPTION

The present application discloses, in various embodiments, semiconductor compositions that can be used to form semiconducting layers that have high mobility. The semiconductor compositions comprise a non-aromatic halogenated hydrocarbon solvent and a donor-acceptor type of semiconducting polymer as described herein. Desirably, the non-aromatic halogenated hydrocarbon solvent contains at least 2 carbon atoms and at least 3 halogen atoms. In some particular embodiments, the semiconducting copolymer is a copolymer comprising an optionally substituted diketopyrrolopyrrole/dithioketopyrrolopyrrole moiety and an optionally substituted thiophene moiety.

Disclosed in some embodiments is a composition comprising: a non-aromatic halogenated hydrocarbon solvent containing at least 2 carbon atoms and at least 3 halogen atoms; and a polymer of Formula (I):

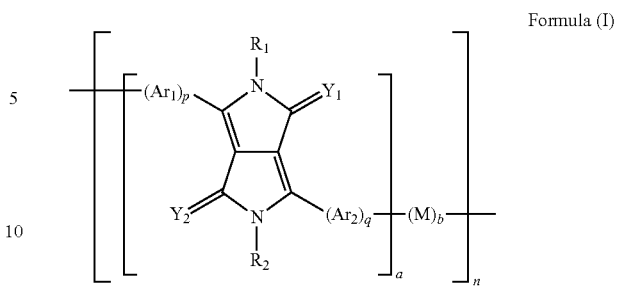

Formula (I)

wherein $R_1$ and $R_2$ are independently hydrogen, alkyl, substituted alkyl, aryl, substituted aryl, heteroaryl, or substituted heteroaryl;
$Y_1$ and $Y_2$ are independently S or O; a is at least 1; the sum of (p+q) is at least 1; M is a conjugated moiety; b is from 0 to about 20; n is from 2 to about 5,000; and each $Ar_1$ and $Ar_2$ unit is independently selected from the group consisting of:

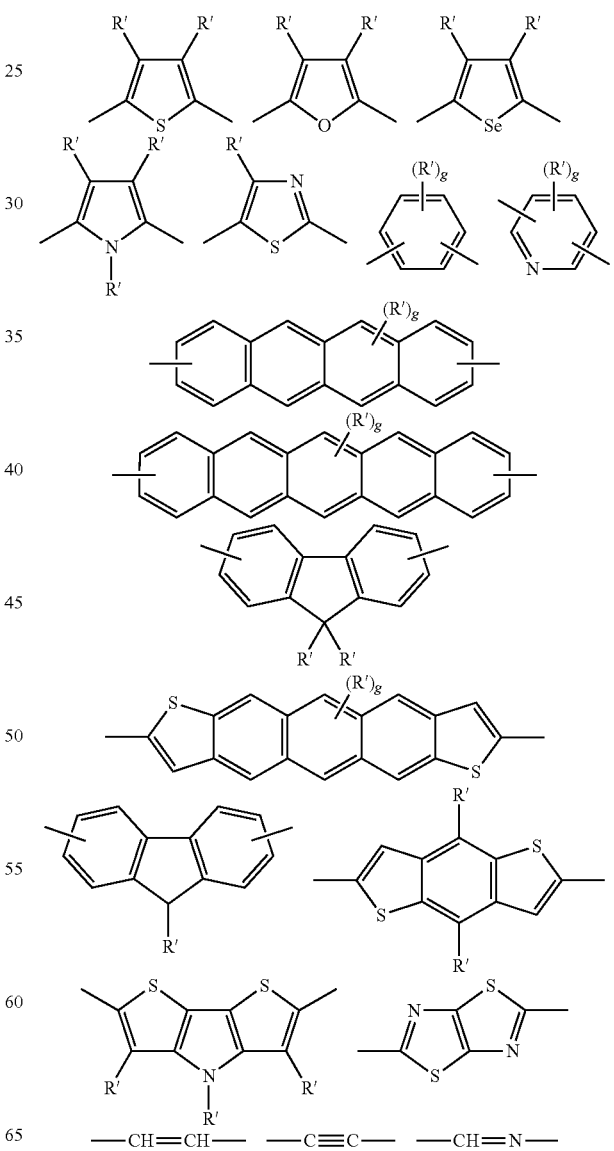

-continued

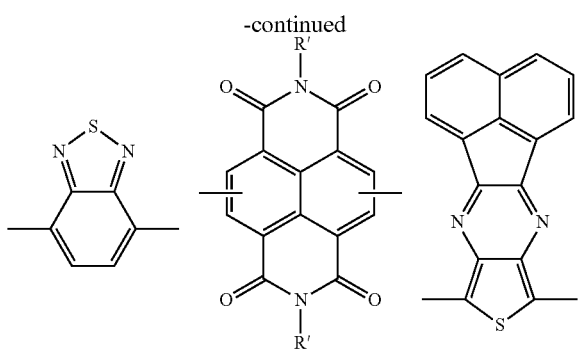

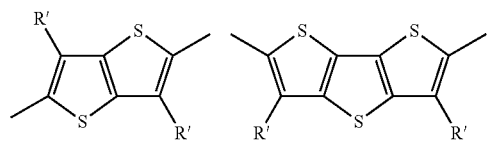

wherein each R' is independently selected from hydrogen, alkyl, substituted alkyl, aryl, substituted aryl, heteroaryl, substituted heteroaryl, halogen, alkoxy, alkylthio, trialkylsilyl, —CN, or —NO$_2$; and g is from 0 to 12.

In particular embodiments, the non-aromatic halogenated hydrocarbon solvent is a chloroalkane. The non-aromatic halogenated hydrocarbon solvent may be selected from the group consisting of 1,1,2,2-tetrachloroethane; 1,1,1,2-tetrachloroethane; 1,1,1,2,2-pentachloroethane; pentaerythrityl tetrachloride; 1,2,3,4-tetrachlorobutane; 1,2,3-trichloropropane; 1,1,2-trichloroethane; and 1,1,2-trichloroethylene. Desirably, the non-aromatic halogenated hydrocarbon solvent is 1,1,2,2-tetrachloroethane.

The polymer may be from about 0.01 wt % to about 5 wt % of the semiconductor composition.

In embodiments of Formula (I), $R_1$ and $R_2$ are alkyl. In others, $Y_1$ and $Y_2$ are O, or $Y_1$ and $Y_2$ are S. Sometimes, b is 0. Other times, the sum of (p+q) is at least 2.

In particular embodiments, the polymer has the structure of Formula (II):

Formula (II)

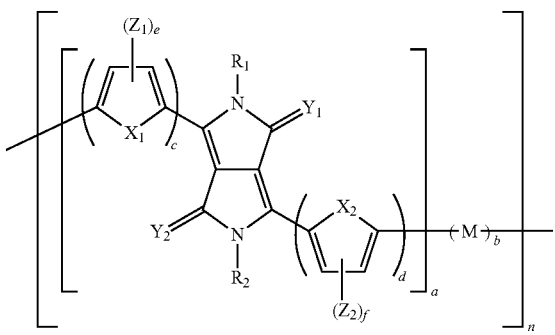

wherein $R_1$ and $R_2$ are independently hydrogen, alkyl, substituted alkyl, aryl, substituted aryl, heteroaryl, or substituted heteroaryl;

$Y_1$ and $Y_2$ are independently S or O;

each $X_1$ and $X_2$ is independently S, Se, O, or NR", wherein each R" can independently be hydrogen, aryl, or alkyl;

each $Z_1$ and $Z_2$ is independently alkyl, substituted alkyl, aryl, substituted aryl, heteroaryl, substituted heteroaryl, halogen, alkoxy, alkylthio, trialkylsilyl, —CN, or —NO$_2$;

M is a conjugated moiety; a is at least 1; b is from 0 to about 20; the sum of (c+d) is at least 1; e and f are independently from 0 to 2; and n is from 2 to about 5,000.

In other embodiments, the polymer has the structure of Formula (III):

Formula (III)

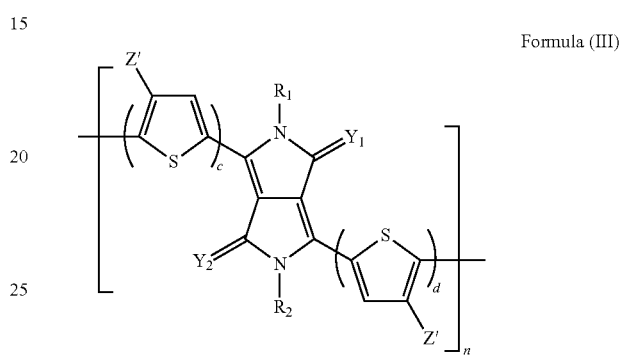

wherein $R_1$ and $R_2$ are independently hydrogen, alkyl, substituted alkyl, aryl, substituted aryl, heteroaryl, or substituted heteroaryl;

$Y_1$ and $Y_2$ are S or O;

each Z' is independently hydrogen, alkyl, substituted alkyl, aryl, substituted aryl, heteroaryl, substituted heteroaryl, halogen, alkoxy, alkylthio, trialkylsilyl, —CN, or —NO$_2$; and c and d are independently 1, 2, 3, or 4.

In still other embodiments, the polymer has the structure of Formula (IV):

Formula (IV)

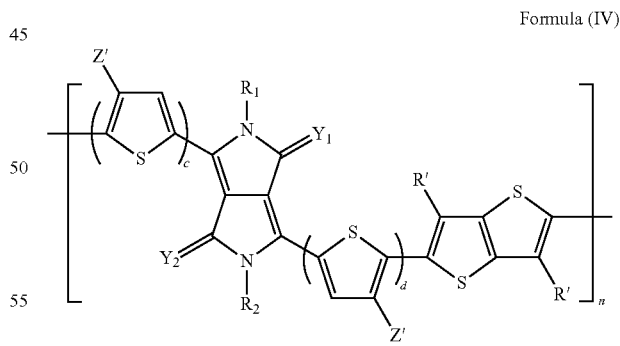

wherein $R_1$ and $R_2$ are independently hydrogen, alkyl, substituted alkyl, aryl, substituted aryl, heteroaryl, or substituted heteroaryl;

$Y_1$ and $Y_2$ are S or O;

each Z' and R' is independently hydrogen, alkyl, substituted alkyl, aryl, substituted aryl, heteroaryl, substituted heteroaryl, halogen, alkoxy, alkylthio, trialkylsilyl, —CN, or —NO$_2$; and c and d are independently 1 or 2.

In some different embodiments, the polymer has the structure of Formula (V):

Formula (V)

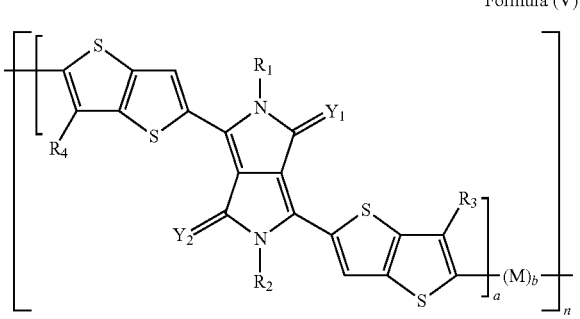

wherein $R_1$ and $R_2$ are independently hydrogen, alkyl, substituted alkyl, aryl, substituted aryl, heteroaryl, or substituted heteroaryl;
$Y_1$ and $Y_2$ are independently S or O;
$R_3$ and $R_4$ are independently hydrogen, alkyl, substituted alkyl, aryl, substituted aryl, heteroaryl, substituted heteroaryl, halogen, alkoxy, alkylthio, trialkylsilyl, —CN, or —$NO_2$;
M is a conjugated moiety; a is at least 1; b is from 0 to about 20; and n is from 2 to about 5,000.

More specifically, the polymer may have the structure of one of Formulas (1) through (22), as discussed more thoroughly within.

The average mobility of a semiconducting layer formed from the semiconductor composition may be at least 50% greater than the average mobility of a semiconducting layer formed from a semiconductor composition containing the same polymer and a different hydrocarbon solvent containing 1 or 2 chlorine atoms, or more than 100% greater than the average mobility of a semiconducting layer formed from a semiconductor composition containing the same polymer and a different hydrocarbon solvent containing 1 or 2 chlorine atoms. Such results were unexpected from the selection of the solvent.

In some embodiments, the average mobility of a semiconducting layer formed from the semiconductor composition is at least 0.5 $cm^2$/V·sec.

In yet other embodiments, the polymer has the structure of Formula (VI):

Formula (VI)

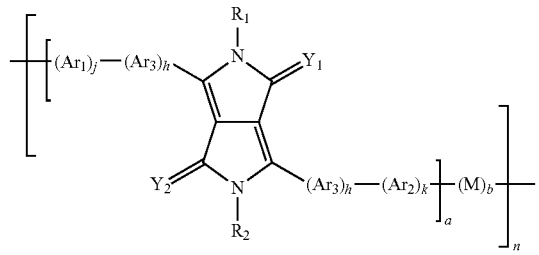

wherein $R_1$ and $R_2$ are independently hydrogen, alkyl, substituted alkyl, aryl, substituted aryl, heteroaryl, or substituted heteroaryl;
$Y_1$ and $Y_2$ are independently S or O;

a is at least 1; h is 0 or 1; the sum of (h+j+k) is at least 1; b is from 0 to about 20; n is from 2 to about 5,000; each $Ar_1$ and $Ar_2$ unit is independently selected from the group consisting of:

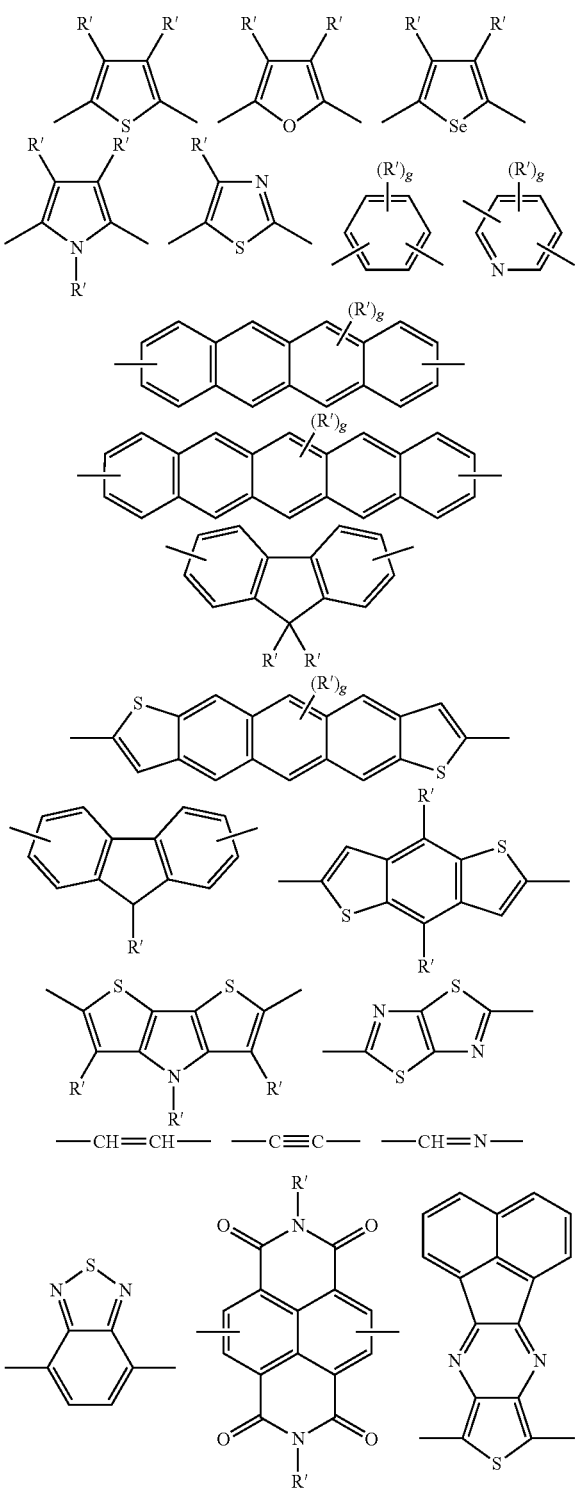

wherein each R' is independently selected from hydrogen, alkyl, substituted alkyl, aryl, substituted aryl, heteroaryl, substituted heteroaryl, halogen, alkoxy, alkylthio, trialkylsilyl, —CN, or —$NO_2$; and g is from 0 to 12;

$Ar_3$ is selected from the group consisting of

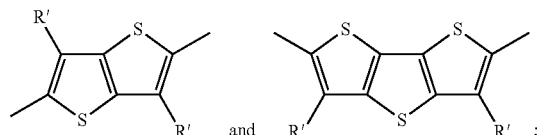

and

M is a conjugated moiety that is not one of the possible choices for $Ar_1$ and $Ar_2$.

Also disclosed in embodiments is a semiconductor composition comprising: 1,1,2,2-tetrachloroethane; and a polymer selected from the group consisting of Formula (1-A), (18), (19), (20), (22), and (21-A):

Formula (1-A)
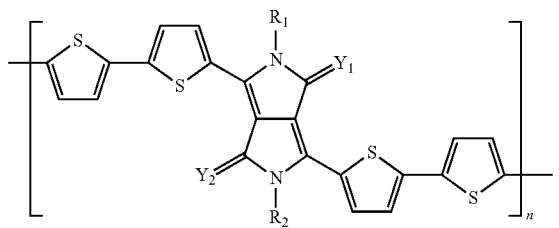

Formula (18)
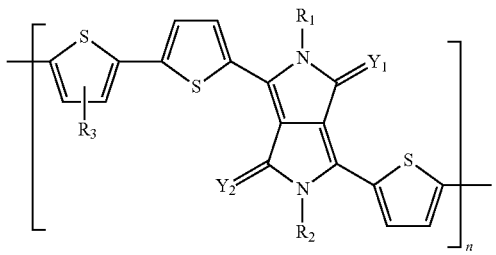

Formula (19)
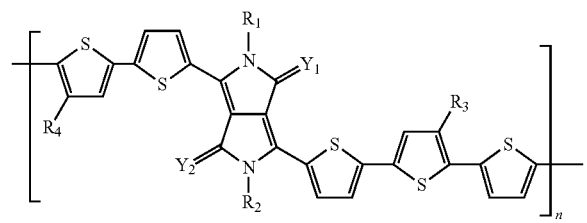

Formula (20)
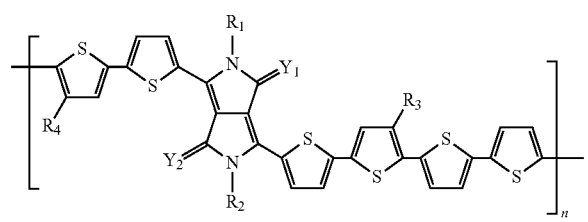

Formula (22)
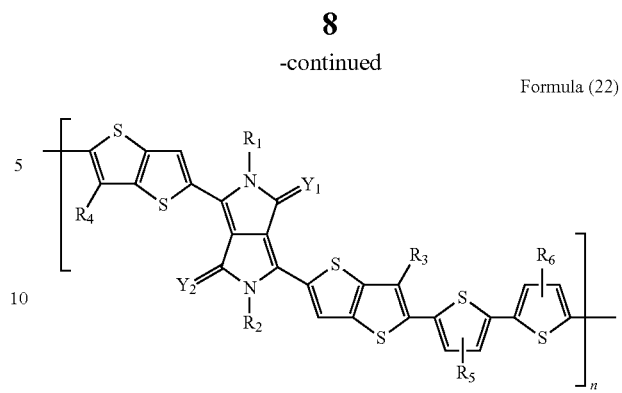

Formula (21-A)
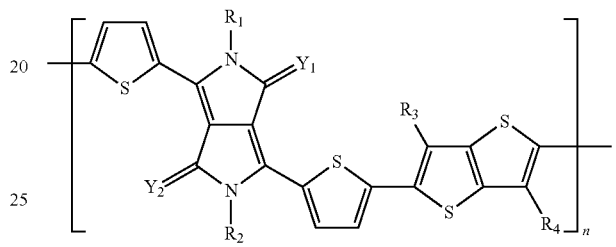

wherein $R_1$ and $R_2$ are independently hydrogen, alkyl, substituted alkyl, aryl, substituted aryl, heteroaryl, or substituted heteroaryl;

$Y_1$ and $Y_2$ are independently S or O; and $R_3$, $R_4$, $R_5$, and $R_6$ are independently hydrogen, alkyl, substituted alkyl, aryl, substituted aryl, heteroaryl, substituted heteroaryl, halogen, alkoxy, alkylthio, trialkylsilyl, —CN, or —NO$_2$.

Still disclosed in other various embodiments is an electronic device comprising a semiconducting layer, wherein the semiconducting layer is formed from a semiconductor composition comprising: a non-aromatic halogenated hydrocarbon solvent containing at least 2 carbon atoms and at least 3 halogen atoms; and a polymer of Formula (I):

Formula (I)
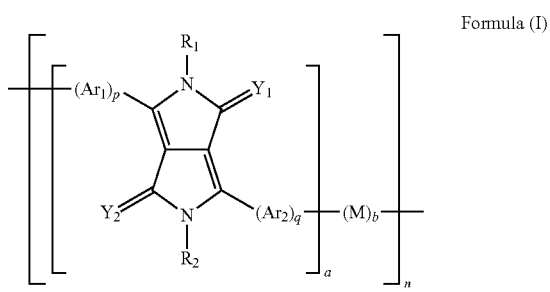

wherein $R_1$ and $R_2$ are independently hydrogen, alkyl, substituted alkyl, aryl, substituted aryl, heteroaryl, or substituted heteroaryl;

$Y_1$ and $Y_2$ are independently S or O; a is at least 1; the sum of (p+q) is at least 1; M is a conjugated moiety; b is from 0 to about 20; n is from 2 to about 5,000; and each $Ar_1$ and $Ar_2$ unit is independently selected from the group consisting of:

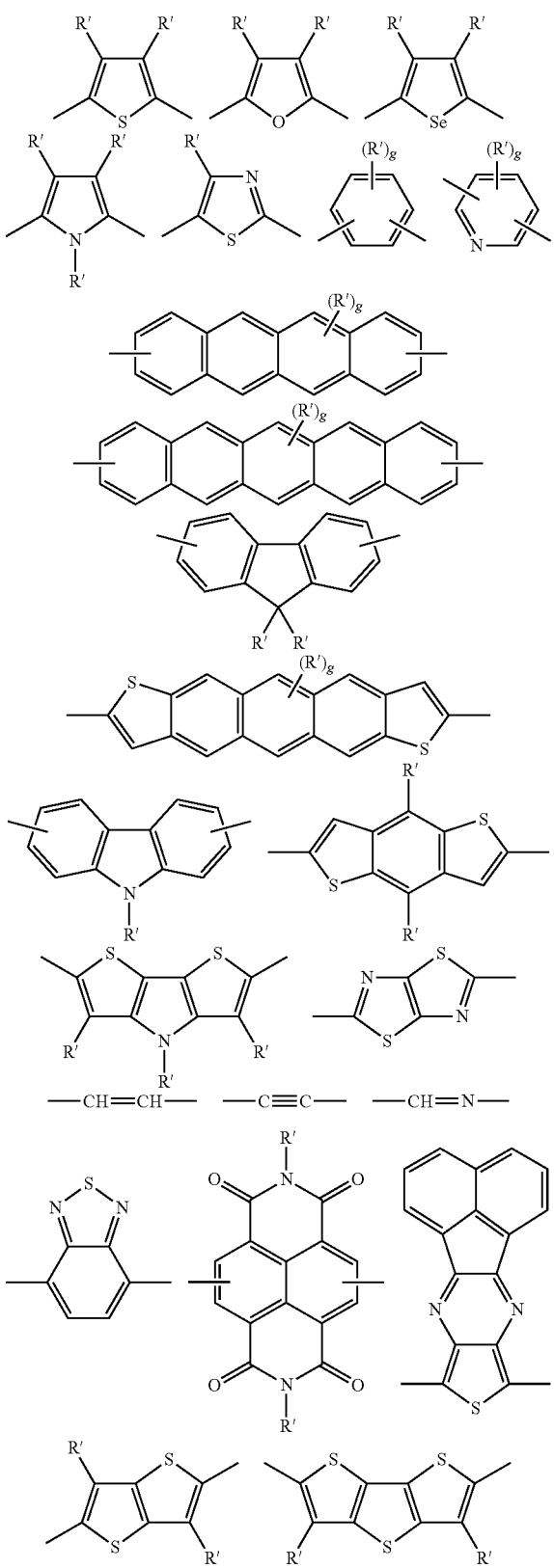

wherein each R' is independently selected from hydrogen, alkyl, substituted alkyl, aryl, substituted aryl, heteroaryl, substituted heteroaryl, halogen, alkoxy, alkylthio, trialkylsilyl, —CN, or —NO$_2$; and g is from 0 to 12;

wherein the average mobility of the semiconducting layer is at least 100% greater than the average mobility of a semiconducting layer formed from a semiconductor composition containing the same polymer and a different hydrocarbon solvent containing 1 or 2 chlorine atoms.

These and other non-limiting characteristics of the disclosure are more particularly disclosed below.

BRIEF DESCRIPTION OF THE DRAWINGS

The following is a brief description of the drawings, which are presented for the purposes of illustrating the exemplary embodiments disclosed herein and not for the purposes of limiting the same.

DETAILED DESCRIPTION

Figure 1:
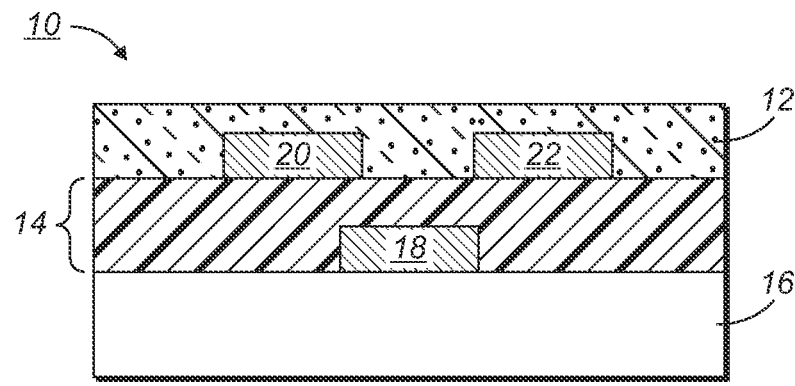
FIG. 1 is a diagram of a first embodiment of a TFT according to the present disclosure.

A more complete understanding of the components, processes and apparatuses disclosed herein can be obtained by reference to the accompanying drawings. These figures are merely schematic representations based on convenience and the ease of demonstrating the present disclosure, and are, therefore, not intended to indicate relative size and dimensions of the devices or components thereof and/or to define or limit the scope of the exemplary embodiments.

Although specific terms are used in the following description for the sake of clarity, these terms are intended to refer only to the particular structure of the embodiments selected for illustration in the drawings, and are not intended to define or limit the scope of the disclosure. In the drawings and the following description below, it is to be understood that like numeric designations refer to components of like function.

The modifier "about" used in connection with a quantity is inclusive of the stated value and has the meaning dictated by the context (for example, it includes at least the degree of error associated with the measurement of the particular quantity). When used in the context of a range, the modifier "about" should also be considered as disclosing the range defined by the absolute values of the two endpoints. For example, the range of "from about 2 to about 10" also discloses the range "from 2 to 10."

The term "comprising" is used herein as requiring the presence of the named component and allowing the presence of other components. The term "comprising" should be construed to include the term "consisting of", which allows the presence of only the named component, along with any impurities that might result from the manufacture of the named component.

The present disclosure relates to semiconductor compositions that can be used to form a semiconducting layer. A semiconducting layer formed from the composition is very stable in air and has high mobility. These semiconductor compositions are useful for forming layers in electronic devices, such as thin-film transistors (TFTs).

FIG. 1 illustrates a bottom-gate bottom-contact TFT configuration according to the present disclosure. The TFT 10 comprises a substrate 16 in contact with the gate electrode 18 and a gate dielectric layer 14. The gate electrode 18 is depicted here atop the substrate 16, but the gate electrode could also be located in a depression within the substrate. The gate dielectric layer 14 separates the gate electrode 18 from the source electrode 20, drain electrode 22, and the semiconducting layer 12. The semiconducting layer 12 runs over and between the source and drain electrodes 20 and 22. The semiconductor has a channel length between the source and drain electrodes 20 and 22.

Figure 2:
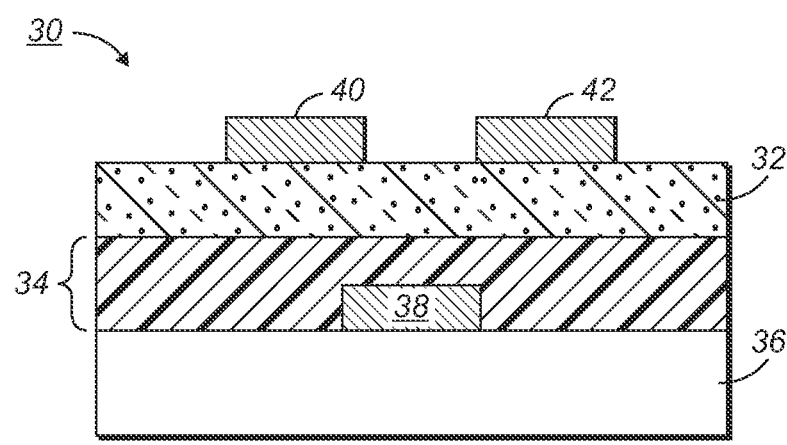
FIG. 2 is a diagram of a second embodiment of a TFT according to the present disclosure.

FIG. 2 illustrates another bottom-gate top-contact TFT configuration according to the present disclosure. The TFT 30 comprises a substrate 36 in contact with the gate electrode 38 and a gate dielectric layer 34. The semiconducting layer 32 is placed on top of the gate dielectric layer 34 and separates it from the source and drain electrodes 40 and 42.

Figure 3:
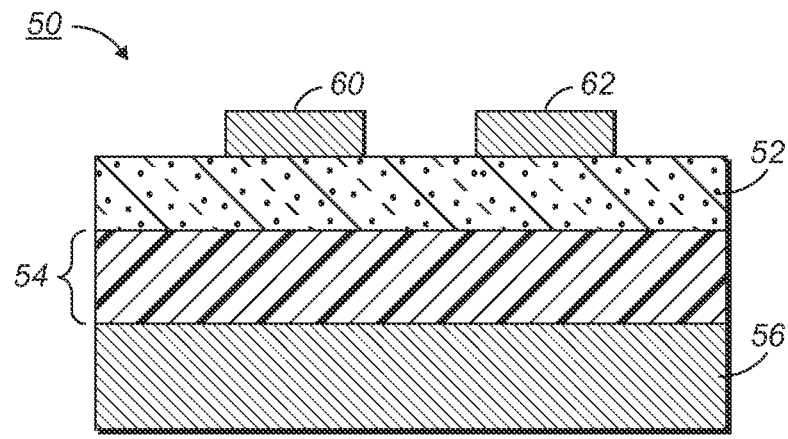
FIG. 3 is a diagram of a third embodiment of a TFT according to the present disclosure.

FIG. 3 illustrates a bottom-gate bottom-contact TFT configuration according to the present disclosure. The TFT 50 comprises a substrate 56 which also acts as the gate electrode and is in contact with a gate dielectric layer 54. The source electrode 60, drain electrode 62, and semiconducting layer 52 are located atop the gate dielectric layer 54.

Figure 4:
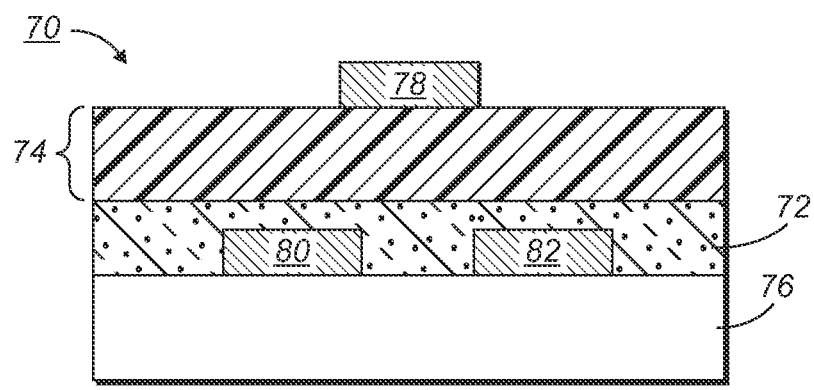
FIG. 4 is a diagram of a fourth embodiment of a TFT according to the present disclosure.

FIG. 4 illustrates a top-gate top-contact TFT configuration according to the present disclosure. The TFT 70 comprises a substrate 76 in contact with the source electrode 80, drain electrode 82, and the semiconducting layer 72. The semiconducting layer 72 runs over and between the source and drain electrodes 80 and 82. The gate dielectric layer 74 is on top of the semiconducting layer 72. The gate electrode 78 is on top of the gate dielectric layer 74 and does not contact the semiconducting layer 72.

The semiconductor compositions of the present disclosure include a non-aromatic halogenated hydrocarbon solvent containing at least 2 carbon atoms and at least 3 halogen atoms; and a semiconducting polymer of Formula (I) to Formula (VI) as described herein.

The non-aromatic halogenated hydrocarbon solvent contains at least 2 carbon atoms and at least 3 halogen atoms. The phrase "non-aromatic" means that the compound used as the solvent is not aromatic. In other words, the compound does not obey Hückel's rule and does not have a delocalized conjugated pi system with a coplanar structure. The term "halogenated" means that the compound contains at least 3 halogen atoms. Halogen atoms include fluorine, chlorine, bromine, and iodine. The term "hydrocarbon" means that the solvent contains carbon atoms and hydrogen atoms, and includes alkanes, alkenes, and alkynes. In specific embodiments, the halogen atom is a chlorine atom.

In some embodiments, the non-aromatic halogenated hydrocarbon solvent contains at least 3 carbon atoms, or at least 4 carbon atoms. In some embodiments, the non-aromatic halogenated hydrocarbon solvent contains at least 4 halogen atoms, or at least 5 halogen atoms. In particular embodiments, the non-aromatic halogenated hydrocarbon solvent contains at least 2 carbon atoms and at least 4 halogen atoms. In others, the non-aromatic halogenated hydrocarbon solvent contains at least 3 carbon atoms and at least 3 halogen atoms. In still others, the non-aromatic halogenated hydrocarbon solvent contains at least 1 hydrogen atom. In particular, embodiments, the non-aromatic halogenated hydrocarbon solvent contains only carbon, hydrogen, and chlorine atoms.

In specific embodiments, the non-aromatic halogenated hydrocarbon solvent is selected from the group consisting of 1,1,2,2-tetrachloroethane (CAS #79-34-5); 1,1,1,2-tetrachloroethane (CAS #630-20-6); 1,1,1,2,2-pentachloroethane (CAS #76-01-7); pentaerythrityl tetrachloride (CAS #3228-99-7); 1,2,3,4-tetrachlorobutane (CAS #3405-32-1); 1,2,3-trichloropropane (CAS #96-18-4); 1,1,2-trichloroethane (CAS #79-00-5); and 1,1,2-trichloroethylene (CAS #79-01-6). Of course, more than one such non-aromatic halogenated hydrocarbon solvent may also be present in the semiconductor composition if desired. In other particular embodiments, the non-aromatic halogenated hydrocarbon solvent is a chloroalkane. Put another way, the only halogen present is chlorine, and the carbon atoms are all single bonds. Desirably, the non-aromatic halogenated hydrocarbon solvent is 1,1,2,2-tetrachloroethane.

Without being limited by theory, it is believed that the Hansen solubility parameters of the solvent should have a large dispersion force component ($\delta_D$), a relatively large polar component ($\delta_P$), and a relatively large hydrogen bonding component ($\delta_H$). In this regard, aromatic halogenated hydrocarbon solvents usually have a low hydrogen bonding component. Table 1 lists several different solvents and their Hansen solubility parameters and boiling points. Several of these solvents are not claimed, and are only provided for reference. The components are shown in units of $MPa^{1/2}$.

TABLE 1

| Solvent | Aromatic? | # carbon atoms | # halogen atoms | $\delta_D$ | $\delta_P$ | $\delta_H$ | bp. (° C.) |
|---|---|---|---|---|---|---|---|
| Benzene | Y | 6 | 0 | 18.4 | 0.0 | 2.0 | 80.1 |
| chlorobenzene | Y | 6 | 1 | 19.0 | 4.3 | 2.0 | 131 |
| o-dichlorobenzene | Y | 6 | 2 | 19.2 | 6.3 | 3.3 | 180 |
| 1,2,4,5-tetrachlorobenzene | Y | 6 | 4 | 21.2 | 10.7 | 3.4 | 246 |
| toluene | Y | 7 | 0 | 18.0 | 1.4 | 2.0 | 110.6 |
| p-chlorotoluene | Y | 7 | 1 | 19.1 | 6.2 | 2.6 | 162 |
| trichlorobiphenyl | Y | 12 | 3 | 19.2 | 5.3 | 4.1 | 317-336 |
| chloromethane | N | 1 | 1 | 15.3 | 6.1 | 3.9 | −23.7 |
| methylene dichloride | N | 1 | 2 | 18.2 | 6.3 | 6.1 | 39 |
| chloroform | N | 1 | 3 | 17.8 | 3.1 | 5.7 | 61.2 |
| carbon tetrachloride | N | 1 | 4 | 17.8 | 0.0 | 0.6 | 76.7 |
| ethyl chloride | N | 2 | 1 | 15.7 | 6.1 | 2.9 | 12.3 |
| 1,1-dichloroethane | N | 2 | 2 | 16.5 | 8.2 | 0.4 | 84 |
| ethylene dichloride | N | 2 | 2 | 19.0 | 7.4 | 4.1 | 84 |
| 1,1-dichloroethylene | N | 2 | 2 | 17.0 | 6.8 | 4.5 | 32 |
| 1,1,1-trifluoroethane | N | 2 | 3 | 14.6 | 10.7 | 0.0 | −47.6 |
| 1,1,1-trichloroethane | N | 2 | 3 | 16.8 | 4.3 | 2.0 | 74 |
| trichloroethylene | N | 2 | 3 | 18.0 | 3.1 | 5.3 | 87.2 |
| 1,1,2-trichloroethane | N | 2 | 3 | 18.2 | 5.3 | 6.8 | 110-115 |
| tetrachloroethylene | N | 2 | 4 | 19.0 | 6.5 | 2.9 | 121.1 |
| 1,1,2,2-tetrachloroethane | N | 2 | 4 | 18.8 | 5.1 | 9.4 | 146.5 |
| 1,1,2-trichlorotrifluoroethane | N | 2 | 6 | 14.7 | 1.6 | 0.0 | 47.6 |
| 1,2-dichlorotetrafluoroethane | N | 2 | 6 | 12.6 | 1.8 | 0.0 | 3.5 |

TABLE 1-continued

| Solvent | Aromatic? | # carbon atoms | # halogen atoms | $\delta_D$ | $\delta_P$ | $\delta_H$ | bp. (° C.) |
|---|---|---|---|---|---|---|---|
| 1-chlorobutane | N | 3 | 1 | 16.2 | 5.5 | 2.0 | 79 |
| 1,1,2,2-tetrachloropropane | N | 3 | 4 | 17.9 | 6.7 | 3.3 | 153.9 |
| n-butane | N | 4 | 0 | 14.1 | 0.0 | 0.0 | −0.5 |
| cyclohexane | N | 6 | 0 | 16.8 | 0.0 | 0.2 | 80.7 |
| cyclohexyl chloride | N | 6 | 1 | 17.3 | 5.5 | 2.0 | 142 |
| perfluoroheptane | N | 7 | 16 | 12.0 | 0.0 | 0.0 | 82-84 |

As seen in Table 2, an aromatic halogenated hydrocarbon solvent such as o-dichlorobenzene has a low hydrogen bonding component of 3.3 MPa$^{1/2}$, whereas the preferred non-aromatic halogenated hydrocarbon solvents have a high hydrogen bonding component, such as 1,1,2,2-tetrachloroethane which has a hydrogen bonding component of 9.4 MPa$^{1/2}$. Similarly, the preferred non-aromatic halogenated hydrocarbon solvents can have a dispersion force component of at least 18.0 MPa$^{1/2}$. In embodiments, the non-aromatic halogenated hydrocarbon solvent has a hydrogen bonding component $\delta_H$ of 5.0 MPa$^{1/2}$ or greater. In embodiments, the non-aromatic halogenated hydrocarbon solvent has a hydrogen bonding component $\delta_H$ of at least 5.0 MPa$^{1/2}$ and a dispersion force component of at least 18.0 MPa$^{1/2}$. In other embodiments, the non-aromatic halogenated hydrocarbon solvent has a boiling point of at least 70° C., including at least 100° C. or at least 120° C. Generally, the non-aromatic halogenated hydrocarbon solvent has a maximum boiling point of about 300° C.

If desired, other solvents may also be present in the semiconductor composition. Such solvents may include toluene, xylene, mesitylene, ethylbenzene, diethylbenzene, trimethyl benzene, methyl ethylbenzene, tetrahydronaphthalene, chlorobenzene, dichlorobenzene, trichlorobenzene, chlorotoluene, methyl isobutyl ketone, methyl benzoate, benzyl benzoate, anisole, cyclohexanone, and acetophenone. Other solvents could be used as well, such as organoamines, methanol, ethanol, propanol, butanol, glycols, acetone, tetrahydrofuran (THF), dichloromethane, ethyl acetate, dimethylformamide (DMF), dimethyl sulfoxide (DMSO), acetic acid, acetonitrile, and dioxane. However, the amount of additional solvents (by weight) is always less than the amount of non-aromatic halogenated hydrocarbon solvent. In some particular embodiments, only non-aromatic halogenated hydrocarbon solvents are present in the semiconductor composition as a solvent.

The semiconducting polymer may have the structure of Formula (I):

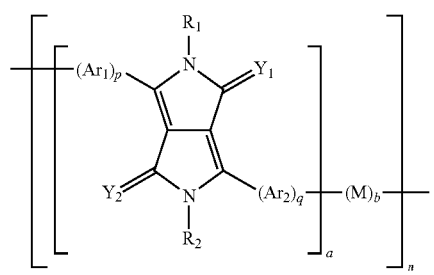

Formula (I)

wherein R$_1$ and R$_2$ are independently hydrogen, alkyl, substituted alkyl, aryl, substituted aryl, heteroaryl, or substituted heteroaryl;

Y$_1$ and Y$_2$ are independently S or O; a is at least 1; the sum of (p+q) is at least 1; M is a conjugated moiety; b is from 0 to about 20; n is from 2 to about 5,000; and each Ar$_1$ and Ar$_2$ unit is independently selected from the group consisting of:

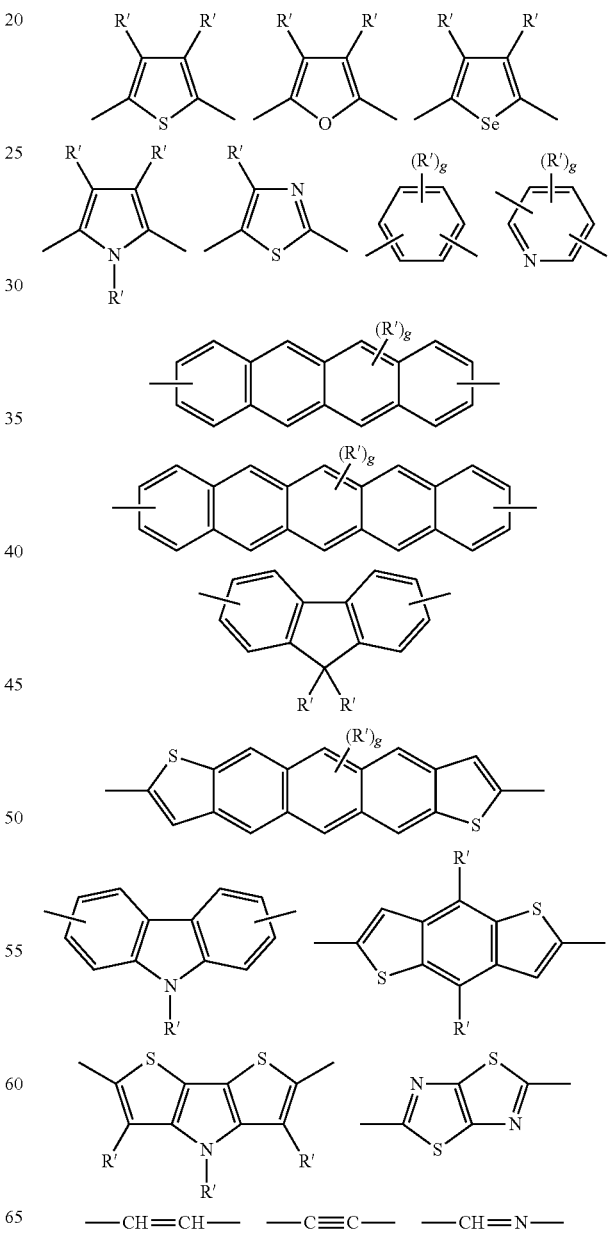

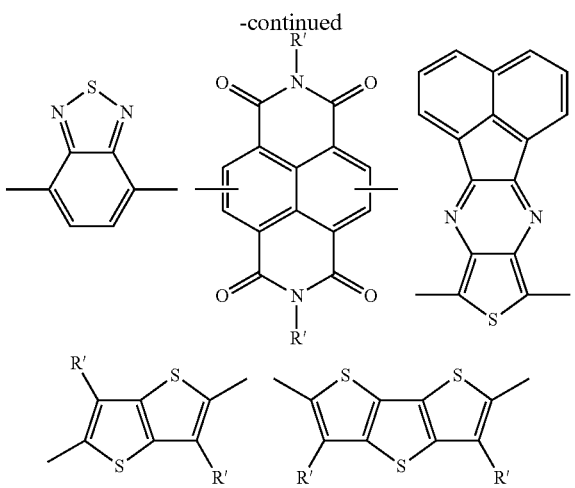

wherein each R' is independently selected from hydrogen, alkyl, substituted alkyl, aryl, substituted aryl, heteroaryl, substituted heteroaryl, halogen, alkoxy, alkylthio, trialkylsilyl, —CN, or —NO$_2$; and g is from 0 to 12.

The term "alkyl" refers to a radical composed entirely of carbon atoms and hydrogen atoms which is fully saturated. The alkyl radical may be linear, branched, or cyclic. The alkyl radical can be univalent or divalent, i.e. can bond to one or two different non-hydrogen atoms.

The term "aryl" refers to an aromatic radical composed entirely of carbon atoms and hydrogen atoms. When aryl is described in connection with a numerical range of carbon atoms, it should not be construed as including substituted aromatic radicals. For example, the phrase "aryl containing from 6 to 10 carbon atoms" should be construed as referring to a phenyl group (6 carbon atoms) or a naphthyl group (10 carbon atoms) only, and should not be construed as including a methylphenyl group (7 carbon atoms). The aryl radical may be univalent or divalent.

The term "heteroaryl" refers to an aromatic radical composed of carbon atoms, hydrogen atoms, and one or more heteroatoms. The carbon atoms and the heteroatoms are present in a cyclic ring or backbone of the radical. The heteroatoms are selected from O, S, and N. Exemplary heteroaryl radicals include thienyl and pyridyl.

The term "halogen" refers to fluorine, chlorine, bromine, and iodine.

The term "alkoxy" refers to an alkyl radical which is attached to an oxygen atom, i.e. —O—C$_n$H$_{2n+1}$.

The term "alkylthio" refers to an alkyl radical which is attached to a sulfur atom, i.e. —S—C$_n$H$_{2n+1}$.

The term "trialkylsilyl" refers to a radical composed of a tetravalent silicon atom having three alkyl radicals attached to the silicon atom, i.e. —Si(R)$_3$. The three alkyl radicals may be the same or different. The silicon atom attaches to the core of the compound.

The term "substituted" refers to at least one hydrogen atom on the named radical being substituted with another functional group, such as halogen, —CN, —NO$_2$, —COOH, and —SO$_3$H. An exemplary substituted alkyl group is a perhaloalkyl group, wherein one or more hydrogen atoms in an alkyl group are replaced with halogen atoms, such as fluorine, chlorine, iodine, and bromine. Besides the aforementioned functional groups, an alkyl group may also be substituted with an aryl or heteroaryl group. An aryl or heteroaryl group may also be substituted with alkyl or alkoxy. Exemplary substituted aryl groups include methylphenyl and methoxyphenyl. Exemplary substituted heteroaryl groups include 3-methylthienyl.

Generally, the alkyl groups independently contain from 1 to 30 carbon atoms. Similarly, the aryl groups independently contain from 6 to 30 carbon atoms. The heteroaryl groups contain from 2 to 30 carbon atoms.

Specific exemplary alkyl groups include methyl, ethyl, propyl, butyl, pentyl, hexyl, heptyl, octyl, nonyl, decyl, undecyl, dodecyl, tridecyl, tetradecyl, pentadecyl, hexadecyl, heptadecyl, octadecyl, cyclopentyl, cyclohexyl, cycloheptyl, t-butyl, isopentyl, isopropyl, 2-octyl-n-dodecyl, and isomers thereof.

Specific exemplary aryl and substituted aryl groups include phenyl, polyphenyl, and naphthyl; alkoxyphenyl groups, such as p-methoxyphenyl, m-methoxyphenyl, o-methoxyphenyl, ethoxyphenyl, p-tert-butoxyphenyl, and m-tert-butoxyphenyl; alkylphenyl groups such as 2-methylphenyl, 3-methylphenyl, 4-methylphenyl, ethylphenyl, 4-tert-butylphenyl, 4-butylphenyl, and dimethylphenyl; alkylnaphthyl groups such as methylnaphthyl and ethylnaphthyl; alkoxynaphthyl groups such as methoxynaphthyl and ethoxynaphthyl; dialkylnaphthyl groups such as dimethylnaphthyl and diethylnaphthyl; and dialkoxynaphthyl groups such as dimethoxynaphthyl and diethoxynaphthyl, other aryl groups listed as exemplary M groups, and combinations thereof.

Specific exemplary heteroaryl groups include oxazole, isoxazole, pyridine, thiazole, isothiazole, imidazole, triazole, pyrazole, furazan, thiadiazole, oxadiazole, pyridazine, pyrimidine, pyrazine, indole, isoindole, indazole, chromene, quinoline, isoquinoline, cinnoline, quinazoline, quinoxaline, naphthylidine, phthalazine, purine, pteridine, thienofuran, imidazothiazole, benzofuran, benzothiophene, benzoxazole, benzthiazole, benzthiadiazole, benzimidazole, imidazopyridine, pyrrolopyridine, pyrrolopyrimidine, pyridopyrimidine, and combinations thereof.

In some specific embodiments of Formula (I), R$_1$ and R$_2$ are the same. In others, R$_1$ and R$_2$ are both alkyl. Y$_1$ and Y$_2$ may be the same, i.e. both O or both S. In additional specific embodiments of Formula (I), b is zero. In others, the sum of (p+q) is at least 2, or is at least 4. The sum of (p+q) may be at most 20. In particular embodiments, Y$_1$ and Y$_2$ are O, b is 0, and the sum of (p+q) is at least 2. In still other embodiments, b may be 0 or 1.

In Formula (I), the M moiety must be different from an Ar$_1$ or Ar$_2$ unit, but can otherwise be chosen from the same moieties that Ar$_1$ and Ar$_2$ are selected from. For example, if Ar$_1$ and Ar$_2$ are unsubstituted thiophene, then M can be a substituted thiophene. In addition, the M moiety has a single ring structure. For example, biphenyl would be considered to be two M moieties, so M is phenyl and b=2. In particular embodiments, M is a conjugated moiety containing from about 4 to about 30 carbon atoms.

Alternatively, the semiconducting polymer may have the structure of Formula (II):

Formula (II)

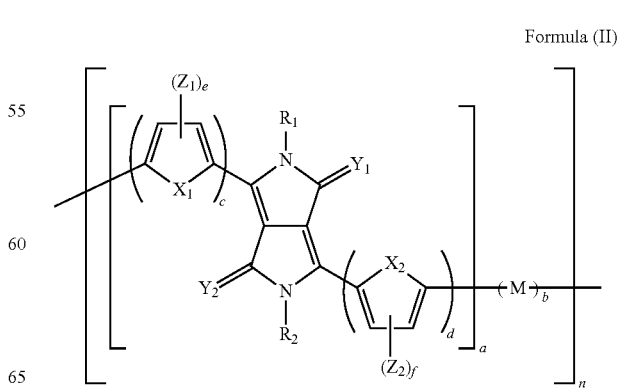

wherein $R_1$ and $R_2$ are independently hydrogen, alkyl, substituted alkyl, aryl, substituted aryl, heteroaryl, or substituted heteroaryl;

$Y_1$ and $Y_2$ are independently S or O;

each $X_1$ and $X_2$ is independently S, Se, O, or NR", wherein each R" can independently be hydrogen, aryl, or alkyl;

each $Z_1$ and $Z_2$ is independently alkyl, substituted alkyl, aryl, substituted aryl, heteroaryl, substituted heteroaryl, halogen, alkoxy, alkylthio, trialkylsilyl, —CN, or —$NO_2$;

M is a conjugated moiety;

a is at least 1; b is from 0 to about 20; the sum of (c+d) is at least 1; e and f are independently from 0 to 2; and n is from 2 to about 5,000.

In some specific embodiments of Formula (II), $R_1$ and $R_2$ are the same. In others, $R_1$ and $R_2$ are both alkyl. $X_1$ and $X_2$ may be the same. In others, $X_1$ and $X_2$ are S. $Y_1$ and $Y_2$ may be the same. In others, $Y_1$ and $Y_2$ are O. In other variants, $X_1$ and $X_2$ are S, and $Y_1$ and $Y_2$ are O. In additional specific embodiments of Formula (II), b is zero. In others, the sum of (c+d) is at least 2, or is at least 4. The sum of (c+d) may be at most 20. In particular embodiments, $X_1$ and $X_2$ are S, b is 0, and the sum of (c+d) is at least 2. In still other embodiments, b may be 0 or 1.

It should be noted that if a moiety in the repeating unit of the polymer of Formula (II) can be construed as corresponding to a five-membered ring containing $X_1/Z_1$ or $X_2/Z_2$, it should be so construed. In this regard, the M moiety cannot be a five-membered ring that would overlap with the rings containing $X_1/Z_1$ or $X_2/Z_2$. Put another way, M is a non-thiophene conjugated moiety. In preferred embodiments, M is a conjugated moiety containing from about 4 to about 30 carbon atoms.

Alternatively, the semiconducting polymer may have the structure of Formula (III):

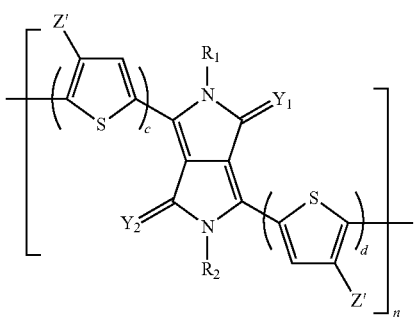

Formula (III)

wherein $R_1$ and $R_2$ are independently hydrogen, alkyl, substituted alkyl, aryl, substituted aryl, heteroaryl, or substituted heteroaryl;

$Y_1$ and $Y_2$ are S or O;

each Z' is independently hydrogen, alkyl, substituted alkyl, aryl, substituted aryl, heteroaryl, substituted heteroaryl, halogen, alkoxy, alkylthio, trialkylsilyl, —CN, or —$NO_2$; and c and d are independently 1, 2, 3, or 4.

In some specific embodiments of Formula (III), $R_1$ and $R_2$ are the same. In others, $R_1$ and $R_2$ are both alkyl. Similarly, Z' may be selected from only hydrogen and alkyl.

Alternatively, the semiconducting polymer may have the structure of Formula (IV):

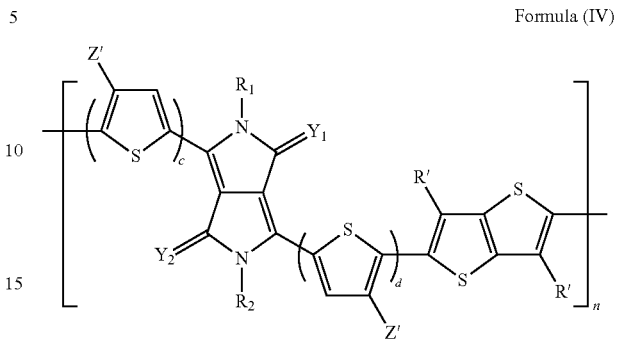

Formula (IV)

wherein $R_1$ and $R_2$ are independently hydrogen, alkyl, substituted alkyl, aryl, substituted aryl, heteroaryl, or substituted heteroaryl;

$Y_1$ and $Y_2$ are S or O;

each Z' and R' is independently hydrogen, alkyl, substituted alkyl, aryl, substituted aryl, heteroaryl, substituted heteroaryl, halogen, alkoxy, alkylthio, trialkylsilyl, —CN, or —$NO_2$; and c and d are independently 1 or 2.

In some specific embodiments of Formula (IV), $R_1$ and $R_2$ are the same. In others, $R_1$ and $R_2$ are both alkyl. Similarly, Z' may be selected from only hydrogen and alkyl.

Alternatively, the semiconducting polymer may have the structure of Formula (V):

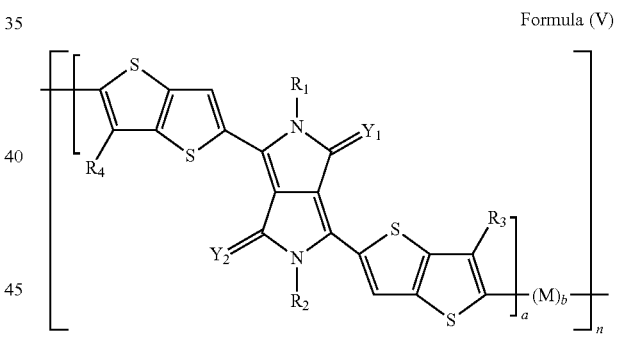

Formula (V)

wherein $R_1$ and $R_2$ are independently hydrogen, alkyl, substituted alkyl, aryl, substituted aryl, heteroaryl, or substituted heteroaryl;

$Y_1$ and $Y_2$ are independently S or O;

$R_3$ and $R_4$ are independently hydrogen, alkyl, substituted alkyl, aryl, substituted aryl, heteroaryl, substituted heteroaryl, halogen, alkoxy, alkylthio, trialkylsilyl, —CN, or —$NO_2$;

M is a conjugated moiety;

a is at least 1; b is from 0 to about 20; and n is from 2 to about 5,000.

In Formula (V), the M moiety can generally be any conjugated moiety, as with Formula (I). In particular embodiments, M is a conjugated moiety containing from about 4 to about 30 carbon atoms.

In some specific embodiments of Formula (V), $R_1$ and $R_2$ are the same. In others, $R_1$ and $R_2$ are both alkyl. Similarly, $R_3$ and $R_4$ are the same in some embodiments. In others, $R_3$ and $R_4$ are selected from only hydrogen and alkyl.

Finally, the semiconducting polymer may have the structure of Formula (VI):

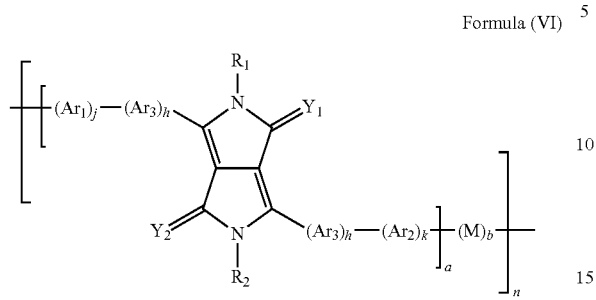

Formula (VI)

wherein $R_1$ and $R_2$ are independently hydrogen, alkyl, substituted alkyl, aryl, substituted aryl, heteroaryl, or substituted heteroaryl;

$Y_1$ and $Y_2$ are independently S or O;

a is at least 1; h is 0 or 1; the sum of (h+j+k) is at least 1; b is from 0 to about 20; n is from 2 to about 5,000;

each $Ar_1$ and $Ar_2$ unit is independently selected from the group consisting of:

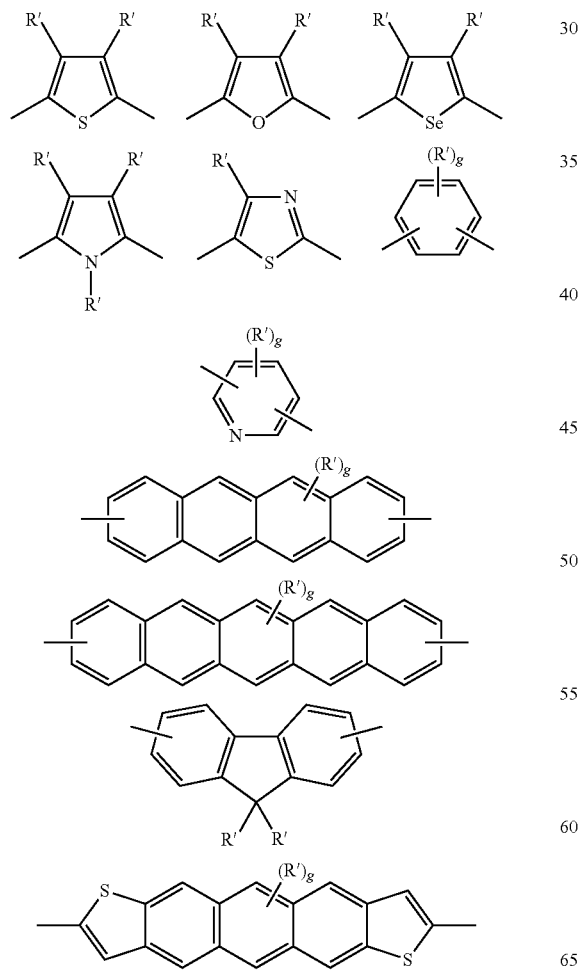

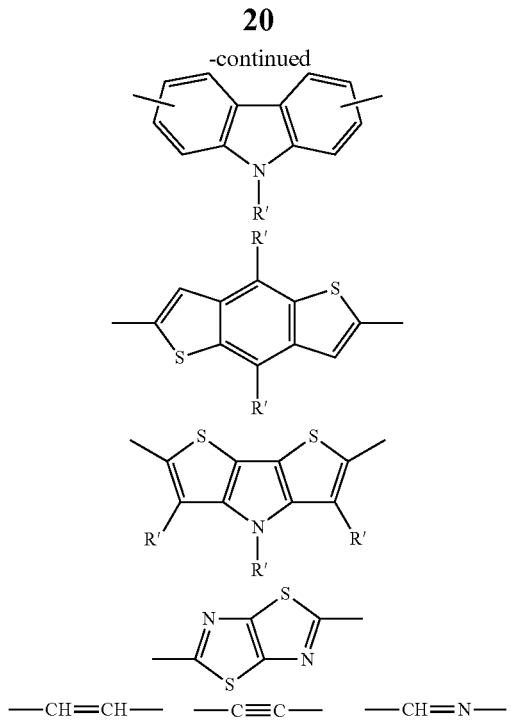

—CH═CH—  —C≡C—  —CH═N—

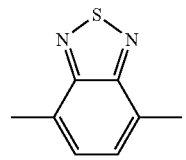

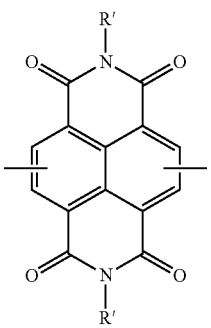

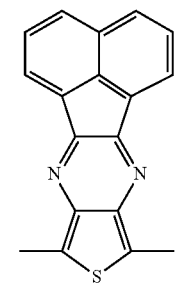

wherein each R' is independently selected from hydrogen, alkyl, substituted alkyl, aryl, substituted aryl, heteroaryl, substituted heteroaryl, halogen, alkoxy, alkylthio, trialkylsilyl, —CN, or —NO$_2$; and g is from 0 to 12;

Ar₃ is selected from the group consisting of

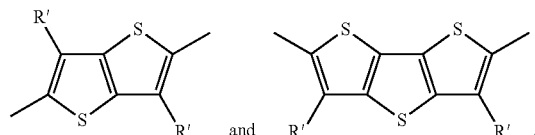

and

M is a conjugated moiety that is not one of the possible choices for Ar₁ and Ar₂.

In Formula (VI), the M moiety cannot be one of the possible choices for Ar₁ and Ar₂. For example, the M moiety cannot be a thiophene unit. However, the M moiety can be a thienothiophene like Ar₃.

In some specific embodiments of Formula (VI), $R_1$ and $R_2$ are the same. In others, $R_1$ and $R_2$ are both alkyl. In some specific embodiments, h=1, and j and k are both 0. In other embodiments, b=0 and h=0. In others, h=1 and b=0.

It should be noted that Formulas (II), (III), (IV), (V), and (VI) are subsets of Formula (I). Similarly, Formulas (III) and (IV) are subsets of Formula (II). Also, Formulas (II), (III), (IV), and (V) are subsets of Formula (VI). The structures of Formulas (I) through (VI) are generally copolymers that include a diketopyrrolopyrrole/dithioketopyrrolopyrrole monomer or moiety. In specific embodiments, the semiconducting polymer is a copolymer comprising an optionally substituted diketopyrrolopyrrole moiety and an optionally substituted thiophene moiety. In other specific embodiments, the semiconducting polymer is a copolymer comprising an optionally substituted dithioketopyrrolopyrrole moiety and optionally substituted thiophene moiety. The structures of Formulas (II), (III), and (IV) are specific examples of such copolymers. Please note that the term "copolymer" is used herein as referring to a polymer containing two or more different monomers. The term "dipolymer" may be used to refer to a polymer containing only two different monomers, while the term "terpolymer" may be used to refer to a polymer containing only three different monomers.

Exemplary semiconducting polymers of these six formulas include those of Formulas (1) through (22):

Formula (1)

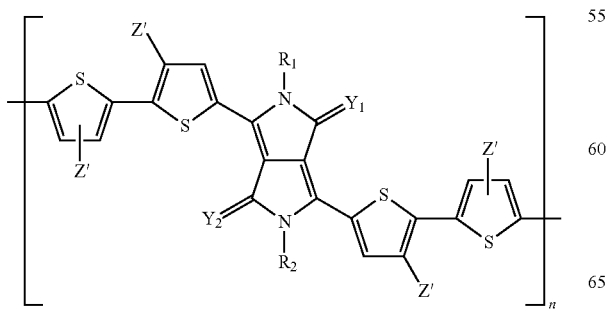

Formula (2)

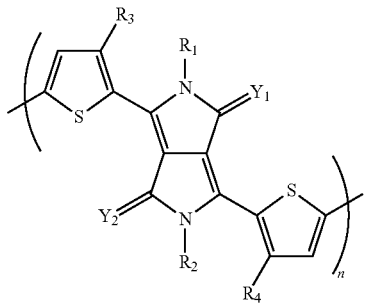

Formula (3)

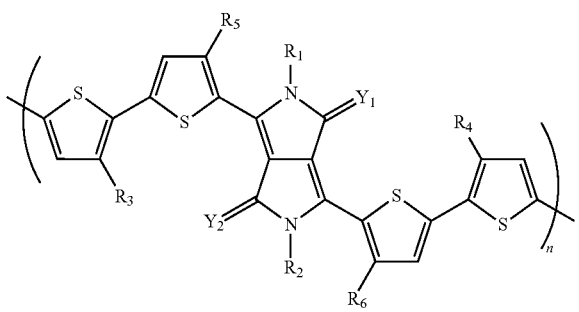

Formula (4)

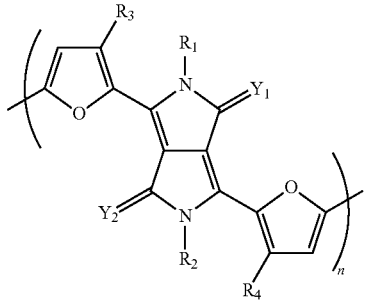

Formula (5)

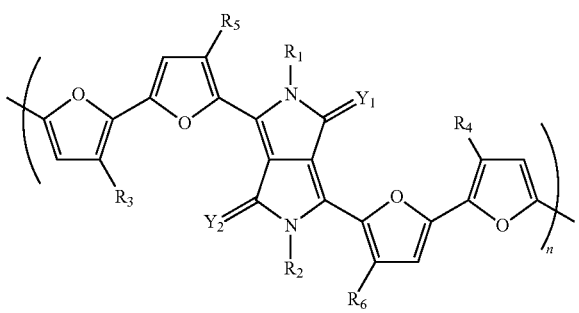

Formula (6)

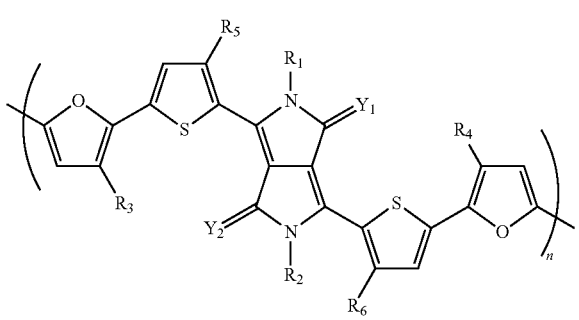

Formula (7)
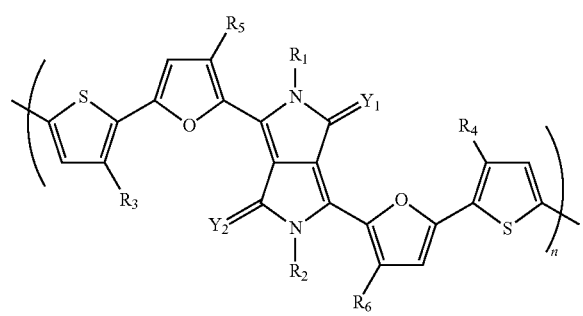
Formula (8)
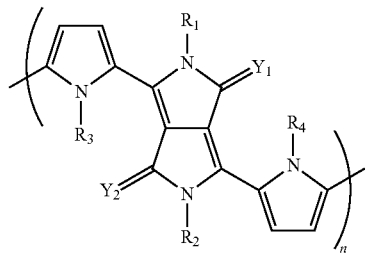
Formula (9)
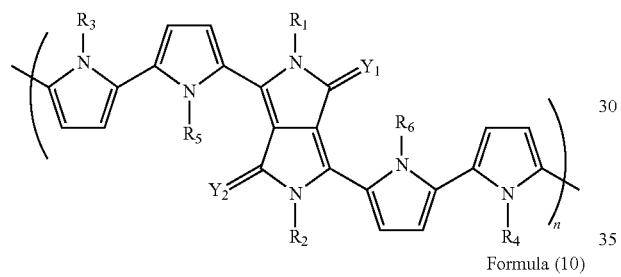
Formula (10)
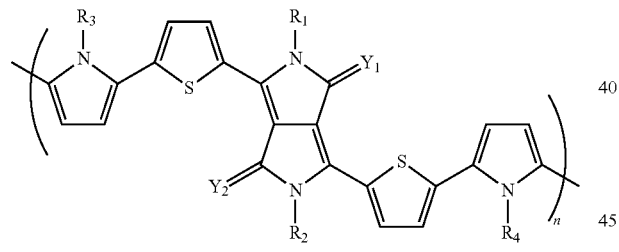
Formula (11)
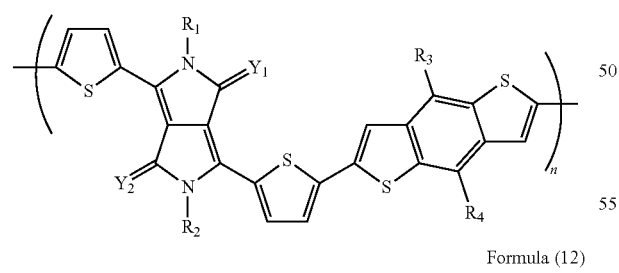
Formula (12)
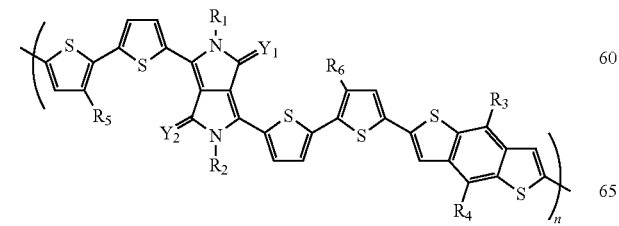
Formula (13)
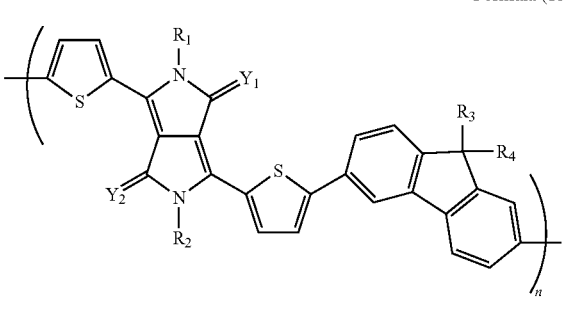
Formula (14)
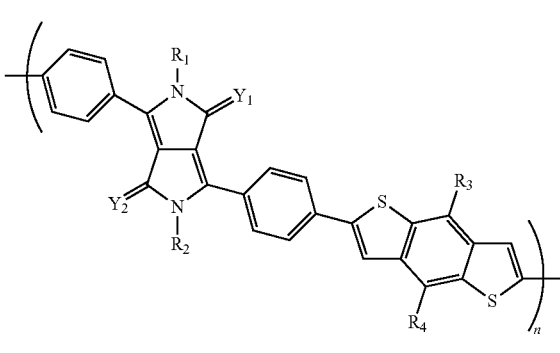
Formula (15)
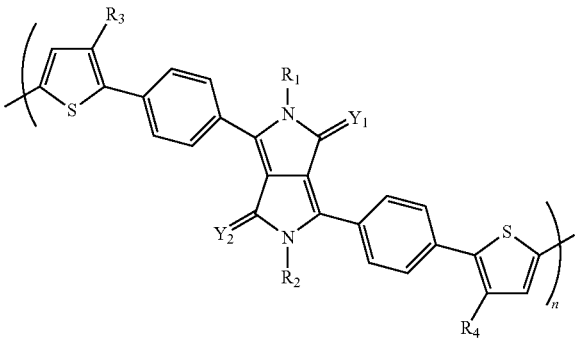
Formula (16)
Formula (17)
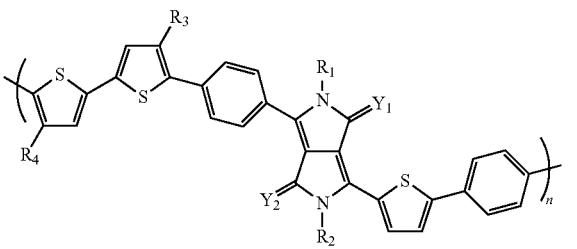

Formula (18)

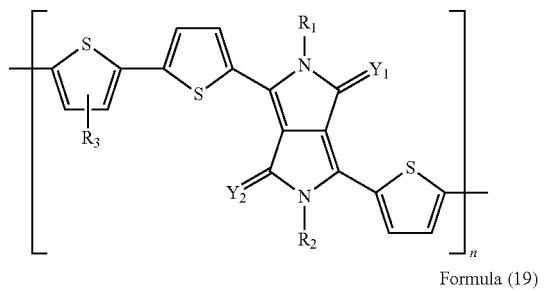

Formula (19)

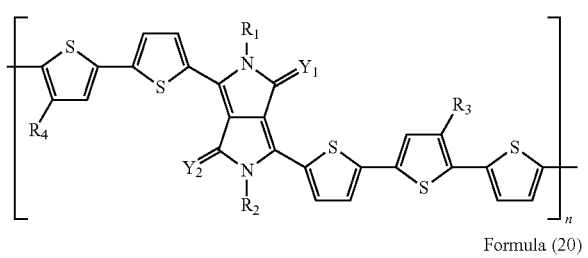

Formula (20)

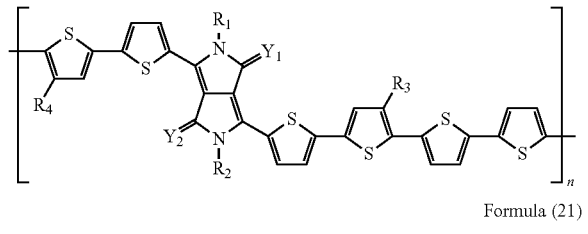

Formula (21)

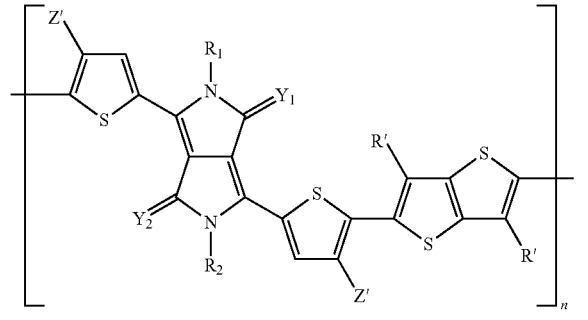

Formula (22)

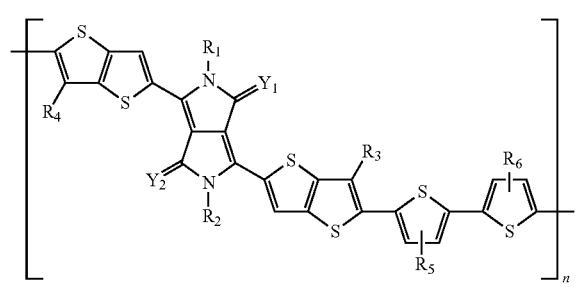

wherein $R_1$ and $R_2$ are independently hydrogen, alkyl, substituted alkyl, aryl, substituted aryl, heteroaryl, or substituted heteroaryl;

$Y_1$ and $Y_2$ are independently S or O; and each Z', R', $R_3$, $R_4$, $R_5$, and $R_e$ is independently hydrogen, alkyl, substituted alkyl, aryl, substituted aryl, heteroaryl, substituted heteroaryl, halogen, alkoxy, alkylthio, trialkylsilyl, —CN, or —NO$_2$.

Formulas (1)-(22) are specific examples of Formula (I). However, Formulas (1)-(16) and (18)-(22) allow b to be 0 or 1. Formula (17) only falls within Formula (I) when b=0.

Formulas (1)-(13) and (18)-(21) are specific examples of Formula (II). Formulas (11)-(13) and (21) only fall within Formula (II) when b=1.

Formulas (1)-(3) and (18)-(20) are specific examples of Formula (III).

Formula (21) is a specific example of Formula (IV). In Formula (21), c=d=1.

Formula (22) is a specific example of Formula (V). In Formula (22), b=2.

Formulas (1)-(22) are specific examples of Formula (VI). Formula (21) only falls within Formula (VI) when b=1. In Formulas (1)-(20) and (22), b=0. Formula (22) is an example of Formula (VI) where h=1.

In some specific embodiments of Formula (1), $Y_1$ and $Y_2$ are O, and $R_1$ and $R_2$ are alkyl. In more specific embodiments, $Y_1$ and $Y_2$ are O, all Z' are hydrogen, and $R_1$ and $R_2$ are alkyl.

In specific embodiments of Formulas (I)-(VI) and Formulas (1)-(22), $R_1$ and $R_2$ are the same and are alkyl. In more particular embodiments, $R_1$ and $R_2$ are long-chain alkyl having from about 12 to about 30 carbon atoms.

Two specific embodiments of polymers include those of Formula (1-A) and (21-A):

Formula (1-A)

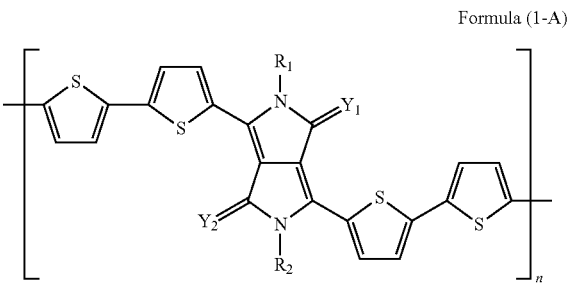

Formula (21-A)

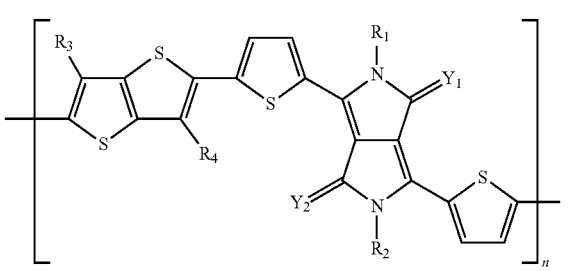

wherein $R_1$ and $R_2$ are independently hydrogen, alkyl, substituted alkyl, aryl, substituted aryl, heteroaryl, or substituted heteroaryl;

$Y_1$ and $Y_2$ are independently S or O; and $R_3$ and $R_4$ are independently hydrogen, alkyl, substituted alkyl, aryl, substituted aryl, heteroaryl, substituted heteroaryl, halogen, alkoxy, alkylthio, trialkylsilyl, —CN, or —NO$_2$.

Formula (1-A) corresponds to Formula (1) when the four Z' units are hydrogen. Similarly, Formula (21-A) corresponds to Formula (21) when the two Z' units are hydrogen and $R_3$ and $R_4$ correspond to R'.

In specific embodiments, the semiconducting polymer of Formulas (I)-(III) and (VI) is a copolymer containing a diketopyrrolopyrrole/dithioketopyrrolopyrrole monomer and a thiophene monomer. In more specific embodiments, the copolymer contains at least two thiophene monomers.

In embodiments, the semiconducting polymer of Formulas (I)-(VI) has a band gap of from about 1.1 to about 3.2 eV, including from about 1.2 to about 2.8 eV, or from about 1.2 to about 2.0 eV. In some embodiments, the semiconducting polymer of Formulas (I)-(VI) has a small band gap from about 1.0 to about 2.0 eV. This small band gap is a result of weak donor and acceptor effects of the repeating units. The diketopyrrolopyrrole unit is an electron accepting moiety, while most of the $Ar_1$ and $Ar_2$ moieties discussed above are electron donating moieties. This combination of electron donors and electron acceptors will result in a small band gap, yet the polymer has very good stability. The semiconducting polymer has a crystalline, semicrystalline, or liquid crystalline structure in the semiconductor layer. Crystallinity can be determined for example using X-ray diffraction method.

In specific embodiments, the semiconducting polymers are diketopyrrolopyrrole-thiophene copolymers, such as those of Formulas (1), (2), (3), (18), (19), or (20).

Figure 5:
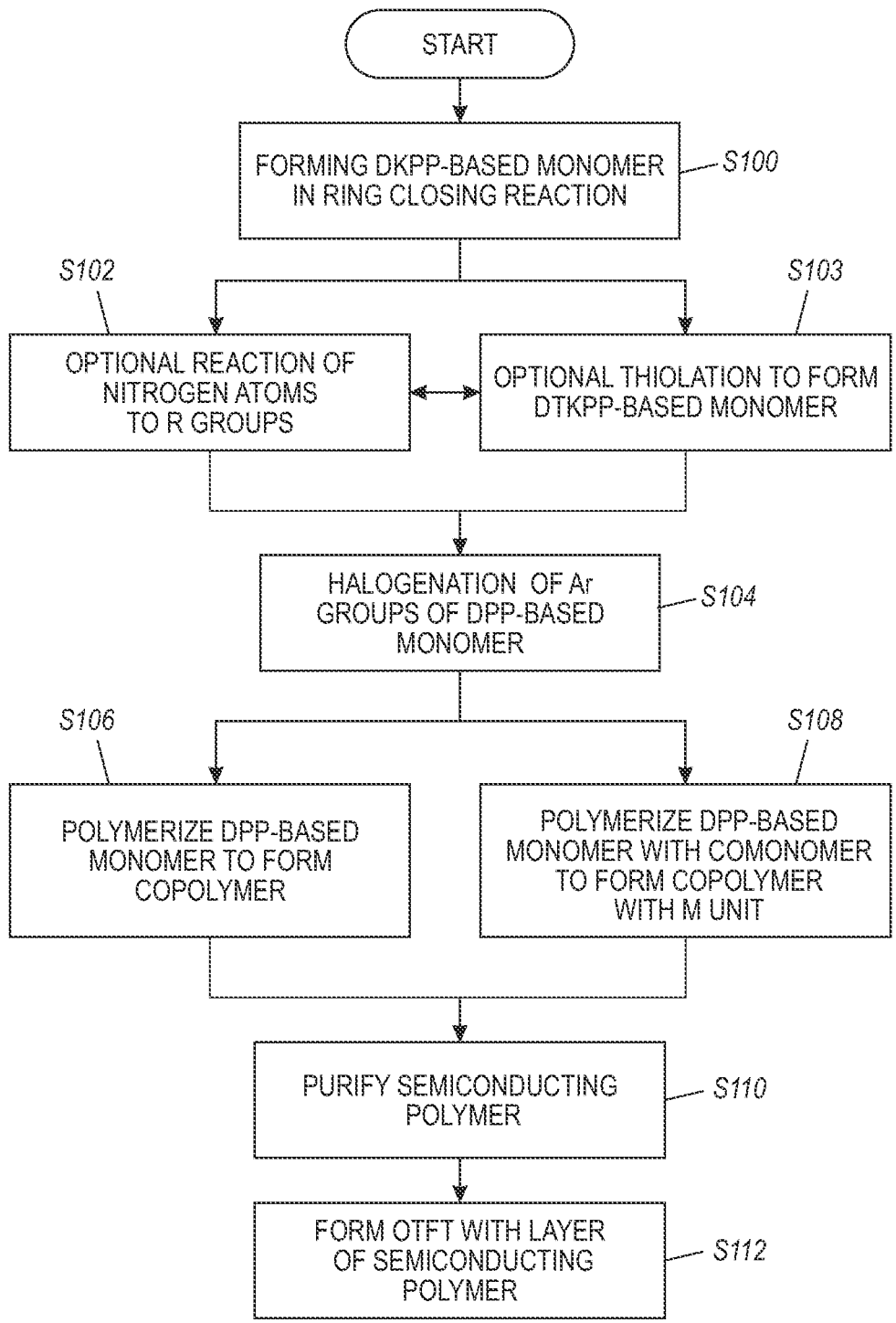
FIG. 5 is a flow chart for an exemplary method of forming a polymer layer in accordance with the disclosure.
Figure 6:
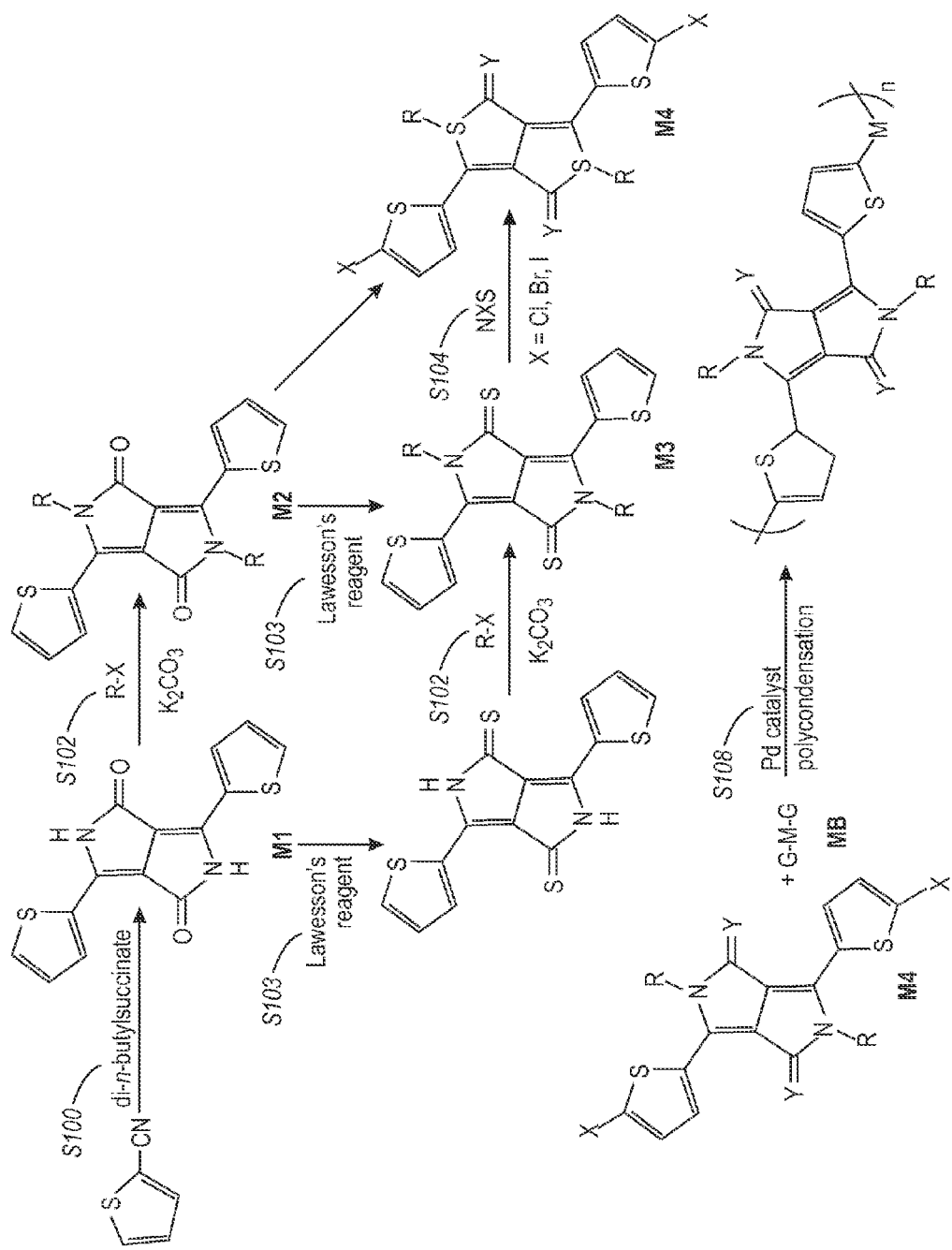
FIG. 6 is a flow chart illustrating an exemplary synthesis of a semiconducting polymer as disclosed herein.

Exemplary polymers of the present disclosure can be prepared by a five-step process, as illustrated in FIG. 5 and FIG. 6. FIG. 6 illustrates various synthesis routes for forming a copolymer of Formula (I), where $Ar_1$ and $Ar_2$ are thiophene groups. The description herein discusses the formation of diketopyrrolopyrrole (DKPP) and dithioketopyrrolopyrrole (DTKPP) moieties, and the phrase DPP will be used to refer generically to either moiety.

At step S100, a DKPP (diketopyrrolopyrrole) moiety may be formed by reacting 2 moles of an appropriate nitrile or a Schiff base with one mole of a succinic acid diester in the presence of a base and an organic solvent. For example, a carbonitrile (Ar—CN) for forming the selected Ar group (e.g., thiophenecarbonitrile) is reacted with a succinate (e.g. diisopropyl succinate or di-n-butyl succinate) under suitable conditions for ring closure of the DKPP moiety to form a monomer M1 of the general formula:

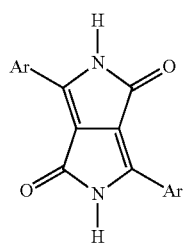

M1 where Ar is as defined above.

For example, step S100 may be carried out in solution in the presence of a sodium alkoxide, such as $t\text{-}C_5H_{11}ONa$, which may be formed in situ, followed by neutralization with an organic acid, such as glacial acetic acid. The reaction may be performed at a suitable reaction temperature, such as about 85° C.

At step S102, the H groups on the nitrogen atoms of the monomer (M1) obtained at step S100 may optionally be converted from H to a selected R group by reaction of the monomer with a halide of the formula R—Y, where R is as defined above (other than H) and Y is a halogen which may be selected from chlorine, bromine, and iodine. A monomer of the following structure (M2) is thus formed:

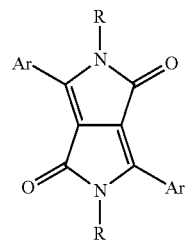

M2

When R is aryl, substituted aryl, heteroaryl, or substituted heteroaryl, an optional palladium or copper catalyst may be required.

Step S102 may be performed in solution at a suitable reaction temperature, such as about 40 to 180° C. (e.g., about 120° C.). The reaction may be carried out in a suitable solvent, such as dimethylformamide, in the presence of an appropriate base, such as an alkali metal hydroxide or carbonate and a crown ether, such as 18-crown-6. Suitable bases include NaH, NaOH, KOH, t-BuONa, t-BuOK, $Na_2CO_3$, $K_2CO_3$ and the like. Usually, the molar ratio of the base to compound M1 is chosen in the range of from 0.5:1 to 50:1.

At optional step S103, the carbonyl groups on the DKPP monomer are thiolated and converted into thiocarbonyl groups to form a DTKPP (dithioketopyrrolopyrrole) moiety. This step may be performed, for example, using Lawesson's reagent.

It should be noted that the alkylation step S102 and thiolation step S103 are both optional, and can be performed in either order (as indicated in FIG. 6). After these two steps, the monomer M3 can be formed:

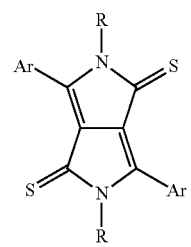

(M3)

where the R in M3 can be hydrogen, alkyl, substituted alkyl, aryl, substituted aryl, heteroaryl, or heteroaryl (depending on whether the alkylation step was performed and the choice of the R group in the alkylation).

At step S104, the Ar groups are halogenated with a halogenating reagent, such as an N-halosuccinimide, to form the DPP monomer M4:

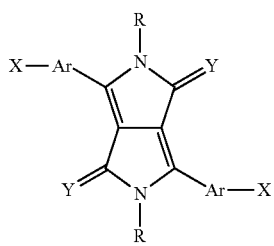

M4

X can be a halogen, such as bromine, chlorine, or iodine. Y here refers to either oxygen or sulfur, depending on whether thiolation step S103 was performed. Step S104 may be carried out in any suitable non-reactive medium, such as chloroform, e.g., at room temperature or above.

Continuing with step S106, the DPP monomer (M4) can be polymerized to form a copolymer of Formula (I) or Formula (II) where no M unit is present, or in other words where b=0.

Alternatively, at step S108, the DPP monomer (M4) is then copolymerized with a comonomer MB to form a copolymer of Formula (I) or Formula (II), wherein the comonomer provides a moiety that is different from the Ar moiety of monomer M4. This may be one way to include a different $Ar_1$ or $Ar_2$ unit into the copolymer. This may also be a way to introduce an M unit, so that b>0. Again, the M unit should be different from the $Ar_1$ and $Ar_2$ units. The exact number of b units within each polymer strand and between M4 monomers may vary, and should be considered statistically.

Step S106 or S108 may be performed in solution in the presence of a di-tin compound, such as an hexaalkyl-di-tin or hexaaryl-di-tin compound such as hexamethylditin, hexa-n-butylditin, or hexaphenylditin, and a catalyst suitable for coupling reactions or for polycondensation reactions, optionally in the presence of copper(I) iodide. A suitable coupling catalyst is a palladium-based catalyst, e.g., a tetrakis(triarylphosphonium)-palladium catalyst, such as tetrakis(triphenylphosphine)palladium(0) $(Pd(PPh_3)_4)$, $Pd(PPh_3)_2Cl_2$, $PdOAc_2$, $Pd(dba)_3$:$P(o-Tol)_3$, or derivatives thereof. Usually, the catalyst is added in a molar ratio of DPP monomer to the catalyst in the range of from about 1000:1 to about 10:1, e.g., from about 100:1 to about 30:1. A suitable solvent for the reaction may be a mixture of THF and 1-methyl-2-pyrrolidinone (NMP). The reaction may be carried out under reflux at a temperature which is at or slightly above the boiling point of the solvent.

For example, the comonomer MB has the formula G-M-G, where M is the conjugated moiety and G is a reactive group that depends on the polycondensation reaction. For example, in a Suzuki reaction, the reactive group G may be one of those shown below:

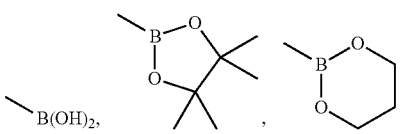

An additional base, such as $K_2CO_3$, $Cs_2CO_3$, $K_3PO_4$, KF, or CsF, is also required for a Suzuki reaction. Alternatively, in a Stille reaction, the reactive group G is a trialkylstannyl group such as —$SnMe_3$ or —$Sn(n-Bu)_3$.

At S110, the resulting polymer may be purified, e.g., by Soxhlet extraction.

The copolymers thus formed may have a weight average molecular weight $M_w$ in the range of from about 700 to about 1,000,000. In some embodiments, the copolymer of Formulas (I)-(VI) has a $M_w$ of about 1,000 to about 800,000, including from about 2,000 to about 500,000.

At S112, a layer comprising the polymer may be incorporated into a semiconductor device.

The copolymers of Formulas (I)-(VI) are soluble in the non-aromatic halogenated hydrocarbon solvent. The resulting semiconductor composition can be used to form the semiconducting layer in an electronic device. In embodiments, the semiconductor composition may have a viscosity of from about 1.5 centipoise (cps) to about 1000 cps, including from about 2 to about 100 cps, or from about 2 to about 20 cps. The semiconductor composition may contain from about 0.01 wt % to about 5 wt % of the semiconducting polymer of Formulas (I)-(VI), based on the weight of the semiconductor composition. In more specific embodiments, the semiconducting polymer of Formulas (I)-(VI) is present in an amount of from about 0.1 wt % to about 2.0 wt %, or from about 0.3 wt % to about 1.0 wt %.

The semiconductor compositions of the present disclosure can be used to form a semiconducting layer in an electronic device using conventional processes known in the art. In embodiments, the semiconducting layer is formed using solution depositing techniques. Exemplary solution depositing techniques include spin coating, blade coating, rod coating, dip coating, screen printing, ink jet printing, stamping, stencil printing, screen printing, gravure printing, flexography printing, and the like.

The semiconductor compositions of the present disclosure can be useful in forming the semiconducting layer of various electronic devices, for example, thin film transistors, photovoltaic, light emitting diodes, light emitting transistors, sensors, and the like.

The semiconducting layer formed using the semiconductor composition can be from about 5 nanometers to about 1000 nanometers deep, including from about 20 to about 100 nanometers in depth. In certain configurations, such as the configurations shown in FIGS. 1 and 4, the semiconducting layer completely covers the source and drain electrodes. The semiconductor channel width may be, for example, from about 5 micrometers to about 5 millimeters with a specific channel width being about 100 micrometers to about 1 millimeter. The semiconductor channel length may be, for example, from about 1 micrometer to about 1 millimeter with a more specific channel length being from about 5 micrometers to about 100 micrometers.

The performance of a TFT can be measured by mobility. The mobility is measured in units of $cm^2/V\cdot sec$; higher mobility is desired. The resulting TFT using the semiconductor composition of the present disclosure may have a field effect mobility of at least 0.4 $cm^2/V\cdot sec$, or at least 0.5 $cm^2/V\cdot sec$. The TFT of the present disclosure may have a current on/off ratio of at least $10^3$.

A thin film transistor generally includes a substrate, an optional gate electrode, source electrode, drain electrode, and a dielectric layer in addition to the semiconducting layer.

The substrate may be composed of materials including but not limited to silicon, glass plate, plastic film or sheet. For structurally flexible devices, plastic substrate, such as for example polyester, polycarbonate, polyimide sheets and the like may be preferred. The thickness of the substrate may be from about 10 micrometers to over 10 millimeters with an exemplary thickness being from about 50 to about 100 micrometers, especially for a flexible plastic substrate and from about 0.5 to about 10 millimeters for a rigid substrate such as glass or silicon.

The dielectric layer generally can be an inorganic material film, an organic polymer film, or an organic-inorganic composite film. Examples of inorganic materials suitable as the dielectric layer include silicon oxide, silicon nitride, aluminum oxide, barium titanate, barium zirconium titanate and the like. Examples of suitable organic polymers include polyesters, polycarbonates, poly(vinyl phenol), polyimides, polystyrene, polymethacrylates, polyacrylates, epoxy resin and the like. The thickness of the dielectric layer depends on the dielectric constant of the material used and can be, for example, from about 10 nanometers to about 500 nanometers. The dielectric layer may have a conductivity that is, for example, less than about $10^{-12}$ Siemens per centimeter (S/cm). The dielectric layer is formed using conventional processes known in the art, including those processes described in forming the gate electrode.

In the present disclosure, the dielectric layer may be surface modified with a surface modifier. Exemplary surface modifiers include organosilanes such as hexamethyldisilazane (HMDS), octyltrichlorosilane (OTS-8), octadecyltrichlorosilane (ODTS-18), and phenyltrichlorosilane (PTS).

The semiconducting layer can be directly contacted with this modified dielectric layer surface. The contact may be complete or partial. This surface modification can also be considered as forming an interfacial layer between the dielectric layer and the semiconducting layer.

The gate electrode is composed of an electrically conductive material. It can be a thin metal film, a conducting polymer film, a conducting film made from conducting ink or paste, or the substrate itself, for example heavily doped silicon. Examples of gate electrode materials include but are not restricted to aluminum, gold, silver, chromium, indium tin oxide, conductive polymers such as polystyrene sulfonate-doped poly(3,4-ethylenedioxythiophene) (PSS-PEDOT), and conducting ink/paste comprised of carbon black/graphite. The gate electrode can be prepared by vacuum evaporation, sputtering of metals or conductive metal oxides, conventional lithography and etching, chemical vapor deposition, spin coating, casting or printing, or other deposition processes. The thickness of the gate electrode ranges for example from about 10 to about 200 nanometers for metal films and from about 1 to about 10 micrometers for conductive polymers. Typical materials suitable for use as source and drain electrodes include those of the gate electrode materials such as aluminum, gold, silver, chromium, zinc, indium, conductive metal oxides such as zinc-gallium oxide, indium tin oxide, indium-antimony oxide, conducting polymers and conducting inks. Typical thicknesses of source and drain electrodes are, for example, from about 40 nanometers to about 1 micrometer, including more specific thicknesses of from about 100 to about 400 nanometers.

Typical materials suitable for use as source and drain electrodes include those of the gate electrode materials such as gold, silver, nickel, aluminum, platinum, conducting polymers, and conducting inks. In specific embodiments, the electrode materials provide low contact resistance to the semiconductor. Typical thicknesses are about, for example, from about 40 nanometers to about 1 micrometer with a more specific thickness being about 100 to about 400 nanometers.

The source electrode is grounded and a bias voltage of, for example, about 0 volt to about 80 volts is applied to the drain electrode to collect the charge carriers transported across the semiconductor channel when a voltage of, for example, about +10 volts to about −80 volts is applied to the gate electrode. The electrodes may be formed or deposited using conventional processes known in the art.

If desired, a barrier layer may also be deposited on top of the TFT to protect it from environmental conditions, such as light, oxygen and moisture, etc. which can degrade its electrical properties. Such barrier layers are known in the art and may simply consist of polymers.

The various components of the OTFT may be deposited upon the substrate in any order. Generally, however, the gate electrode and the semiconducting layer should both be in contact with the gate dielectric layer. In addition, the source and drain electrodes should both be in contact with the semiconducting layer. The phrase "in any order" includes sequential and simultaneous formation. For example, the source electrode and the drain electrode can be formed simultaneously or sequentially. The term "on" or "upon" the substrate refers to the various layers and components with reference to the substrate as being the bottom or support for the layers and components which are on top of it. In other words, all of the components are on the substrate, even though they do not all directly contact the substrate. For example, both the dielectric layer and the semiconducting layer are on the substrate, even though one layer is closer to the substrate than the other layer. The resulting TFT has good mobility and good current on/off ratio.

The following examples are for purposes of further illustrating the present disclosure. The examples are merely illustrative and are not intended to limit the present disclosure to the materials, conditions, or process parameters set forth therein.

EXAMPLES

Example 1

Poly(2,5-dioctadecyl-3,6-bis(thienyl-5-yl)-diketopyrrolopyrrole was synthesized as outlined in Scheme 1 below. This copolymer falls within Formula (I), Formula (II), and Formula (2) where $Y_1=Y_2=O$, $R_1=R_2=C_{18}H_{37}$, and $R_3=R_4=H$.

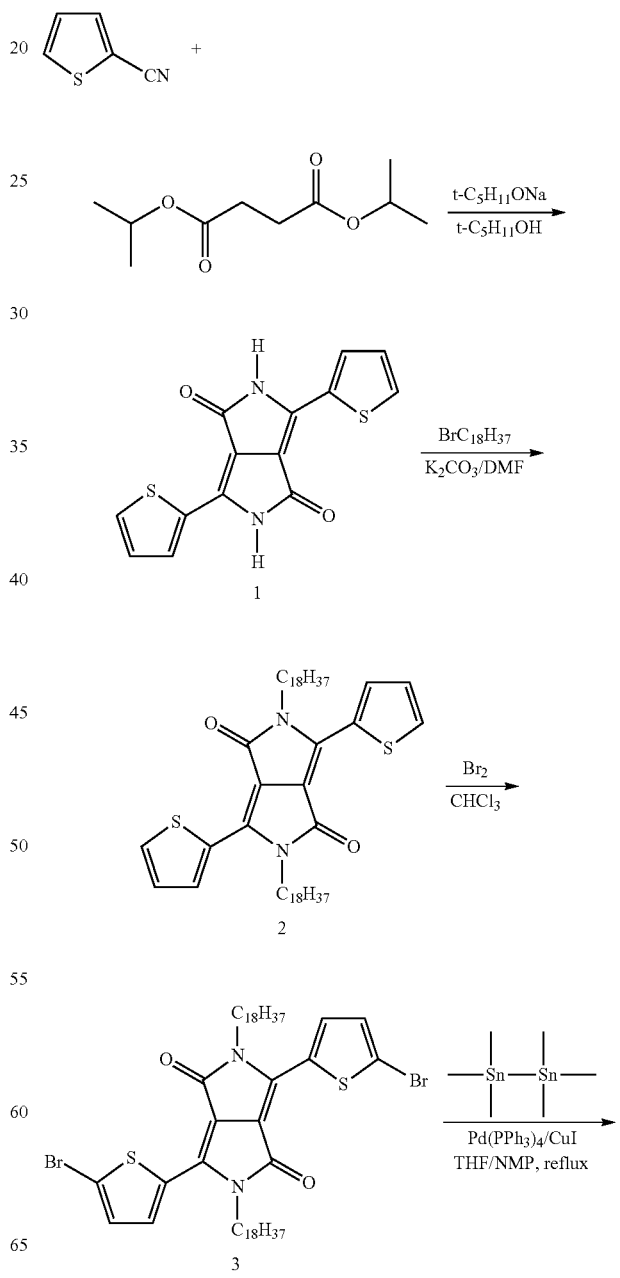

Scheme 1. Synthesis of polymer 4.

-continued

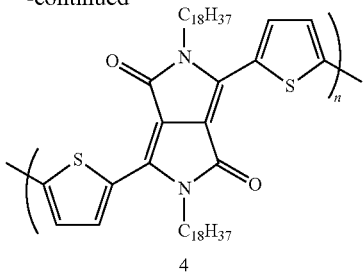

4

Synthesis of 3,6-Bis-(thienyl)-diketopyrrolopyrrole (1)

Sodium (3.45 grams, 0.15 mol) was added to 60 mL of t-amyl alcohol and a small amount of iron(III) chloride (50 mg) was added. The mixture was stirred vigorously for 1 hour at 95-102° C. until the sodium disappeared. The solution was cooled to 85° C. To the resultant solution was added 10.9 grams (0.1 mol) of 2-thiophenecarbonitrile. Then, 8.3 grams (0.04 mol) of diisopropyl succinate in 5 mL of t-amyl alcohol was added drop-wise over 1 hour at 85° C. When addition was complete, the mixture was maintained for 2 hours at this temperature. The reaction mixture was then cooled to 50° C., diluted with 50 mL of methanol, and then slowly neutralized with ~15 mL of glacial acetic acid and refluxed briefly, and the reaction mixture was filtered. After the residue was washed several times with hot methanol and water, the resultant solid was dried in vacuo at 50° C. A bluish-red solid (11 grams, yield 92%) was obtained (compound (1)). The solid was analyzed with NMR, with the results being as follows: $^1$H NMR (DMSO-D6): 11.23 (s, 2H), 8.20 (d, J=3.7 Hz, 2H), 7.95 (d, J=4.9 Hz, 2H), 7.29 (dd, J1=3.7 Hz, J2=4.9 Hz, 2H).

2,5-Dioctadecyl-3,6-bis-(thienyl)-diketopyrrolopyrrole (2)

A mixture of compound (1) (1.5 grams, 5 mmol), 2.31 grams (16.7 mmol) of $K_2CO_3$, 12 mg of 18-crown-6, and 1-bromooctadecane (5.57 grams, 16.7 mmol) in 75 mL of dimethylformamide (DMF) was heated at 120° C. overnight. After being cooled to room temperature, the solution was filtered, and the solid was washed with water several times. The solid was dissolved in chloroform by heating and filtered. The filtrate was cooled to room temperature and red precipitates formed. The solid was filtered and dried in vacuo (compound (2)). Yield: 3.01 g (74.7%). $^1$H NMR (CDCl3): 8.93 (dd, J1=3.9 Hz, J2=1.1 Hz, 2H), 7.64 (dd, J1=5.0 Hz, J2=1.1 Hz, 2H), 7.28 (dd, J1=5.0 Hz, J2=3.9 Hz, 2H), 4.07 (t, J=7.8 Hz, 4H), 1.74 (m, 4H), 1.20-1.50 (m, 60H), 0.88 (t, J=6.6 Hz, 6H). Melting point: 124° C.

2,5-Dioctadecyl-3,6-bis-(5-bromothienyl)-diketopyrrolopyrrole (3)

Compound (2) (4.416 grams, 3 mmol) and 30 mL of chloroform were added to a 100 mL three-necked flask equipped with a stirring bar, a condenser, and an addition funnel. Then, 0.96 grams (6 mmol) of $Br_2$ in 20 mL of chloroform was added to the flask at room temperature. The mixture was stirred at room temperature for 10 minutes and then warmed to 60° C. and stirred for an additional hour. The reaction mixture was then cooled to room temperature and filtered. The red solid was washed with $Na_2SO_3$ solution, water and finally washed with methanol extensively. The solid was then dissolved in chloroform by heating and then cooled down to room temperature. After filtration, a dark purple solid was obtained, which was dried in vacuo. Yield: 1.78 grams (61.6%). $^1$H NMR (CDCl3): 8.69 (d, J=4.2 Hz, 2H), 7.24 (d, J=4.2 Hz, 2H), 3.98 (t, J=7.7 Hz, 4H), 1.71 (m, 4H), 1.20-1.50 (m, 60H), 0.88 (t, J=6.6 Hz, 6H). Melting point: 161° C.

Poly(2,5-dioctadecyl-3,6-bis(thienyl-5-yl)-diketopyrrolopyrrole) (4)

To a 100 mL flask were added hexamethylditin (0.344 grams, 1.05 mmol), tetrakis(triphenylphosphine)palladium (0), $Pd(PPh_3)_4$ (58 mg, 0.05 mmol), copper(I) iodide (3.8 mg, 0.02 mmol), compound (3) (0.9631 g, 1 mmol), THF (30 mL), and 1-methyl-2-pyrrolidinone (NMP) (15 mL). The reaction mixture was heated to reflux for 48 hours and then cooled down to room temperature and poured into 200 mL of stirring acetone. The solid was filtered off, washed with methanol, and dried. The solid was then further purified by Soxhlet extraction using heptane for 48 hours, and then dissolved with chlorobenzene. Upon removal of solvent, a dark blue solid was obtained (0.50 grams, 62.5%) (compound (4)).

Example 2

A diketopyrrolopyrrole-thiophene copolymer of Formula (A) (referred to hereafter as Polymer A) was synthesized:

Formula (A)

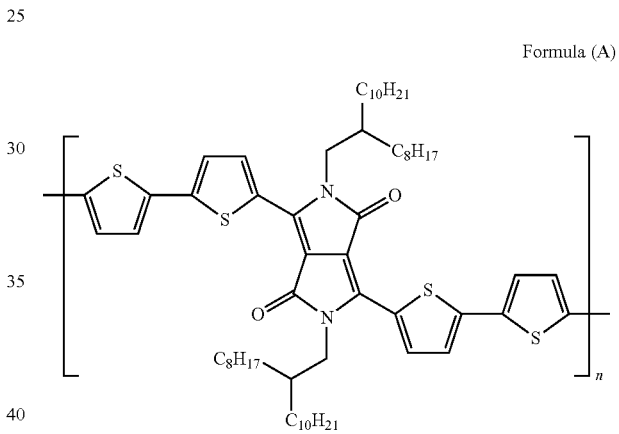

In a 2-necked 100 mL round-bottomed flask 3,6-bis(5-bromothiophen-2-yl)-2,5-bis(2-octyldodecyl)pyrrolo[3,4-c]pyrrole-1,4(2H,5H)-dione (1.051 grams, 1.031 mmol) and 5,5'-bis(trimethylstannyl)-2,2'-bithiophene (0.507 grams, 1.031 mmol) were combined. The flask was fitted with a condenser and flushed with argon for 15 minutes. In a separate flask, anhydrous toluene was degassed by bubbling argon through the solvent for at least 30 minutes. The reactants were dissolved in anhydrous, deoxygenated toluene (25 mL) and the reaction was treated with $Pd(PPh_3)_4$ (0.060 grams, 0.052 mmol). The reaction mixture was then heated to an external temperature of 95° C. and stirred under an argon atmosphere. After 24 hours, the reaction mixture was treated with 2-bromothiophene (0.100 mL, 1.031 mmol) to end-cap the polymer chains. After 2 hours, the heating source was removed and the warm reaction mixture was poured into a mixture of deionized water (50 mL) and methanol (450 mL) to precipitate the polymer. The residual polymer was dissolved in $CHCl_3$ and added into the methanol solution. The crude polymer was collected by vacuum filtration and dried under high vacuum. The crude polymer was purified by Soxlet extraction with methanol (125 mL, 90° C., 4 hours), acetone (125 mL, 85° C., 4 hours), and hexanes (125 mL, 90° C., 18 hours) to remove any impurities and low molecular weight oligomers. The purified polymer was extracted into $CHCl_3$ (125 mL, 90° C., 4 hours) and poured into methanol (500 mL). The precipitated polymer was collected by vacuum filtration and dried under high vacuum. The polymer of Formula (A) was isolated as a dark purple solid (1.0 gram, >95%).

Device Fabrication and Test Results

In this example, 1,1,2,2-tetrachloroethane was used as the solvent. 12 mg of Polymer A was dissolved in 2 grams of 1,1,2,2-tetrachloroethane solvent with the assistance of heat and shaking to form a dark blue solution. The solution (0.6 wt % Polymer A) is stable at room temperature for days without precipitation.

A silicon wafer was provided as a substrate for an electronic device. Heavily doped silicon was used as a gate electrode. A 200-nm thick silicon oxide layer served as the gate dielectric layer. The surface of the silicon oxide layer was modified with octyltrichlorosilane.

After being filtered with a 0.2 micron syringe filter, the solution was spin coated at 2000 rpm onto the silicon wafer. A very smooth and shiny semiconducting film was obtained. After drying and annealing in a vacuum oven at 150° C. for 10 minutes, gold source/drain electrodes were vapor evaporated on top of the semiconducting layer to form a series of transistors. At least 10 transistors were evaluated using a Keithley SCS4200 system at ambient conditions.

Figure 7:
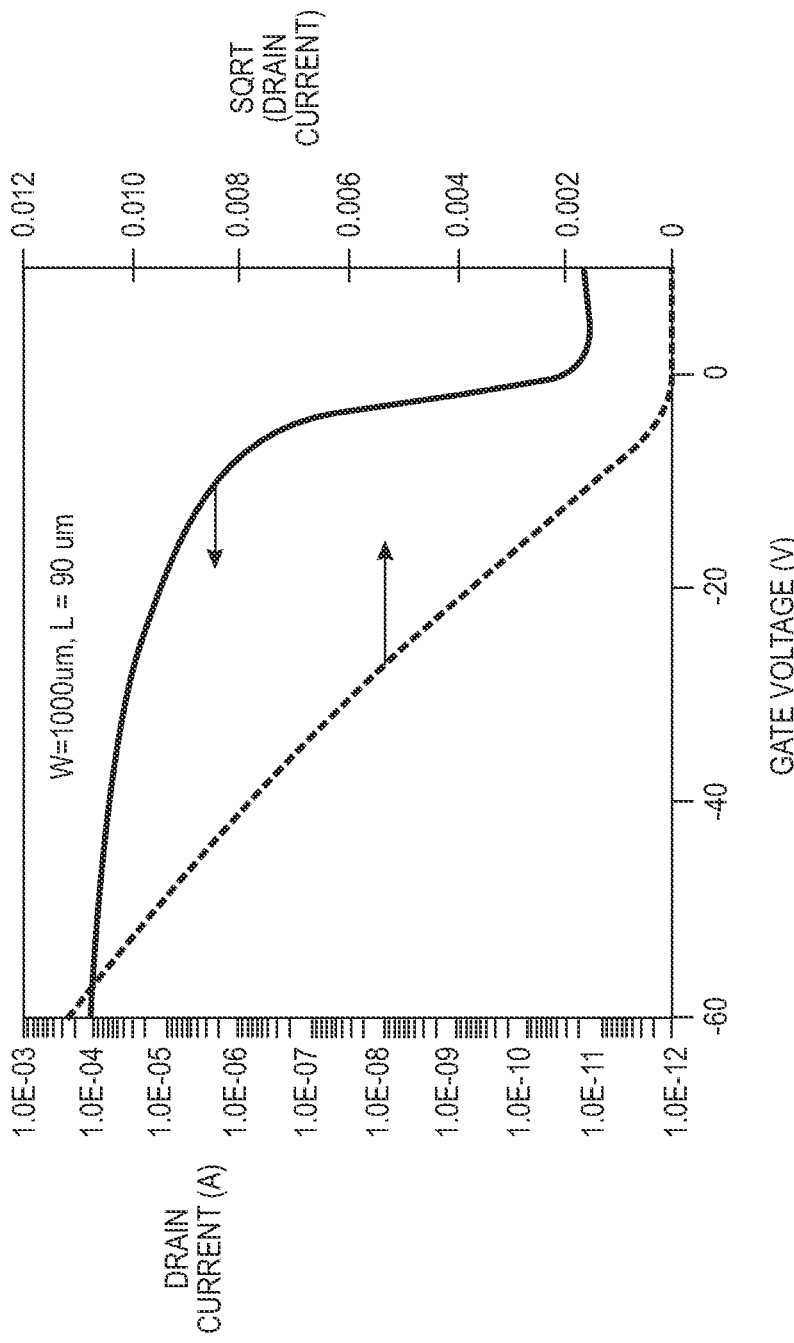
FIG. 7 is a chart showing a transfer curve for a transistor in which a semiconductor composition of the present disclosure is used.

FIG. 7 shows a typical transfer curve for a transistor with channel length of 90 and channel width of 1000 micrometers. The devices exhibited very a high current on/off ratio over $10^7$, and the mobility was calculated to have a maximum value of 0.87 cm$^2$/V·sec. The transistors showed an average mobility of 0.65 cm$^2$/V·sec.

Comparative Example 1

In this comparative example, chloroform was used as the solvent. The devices were fabricated using a similar procedure as described above.

Although Polymer A was readily soluble in chloroform, in some cases, no semiconductor film could be obtained upon spin coating. The chloroform solution would not remain on the octyltrichlorosilane-modified surface. In other cases, a cloudy film was obtained due to fast evaporation of the solvent. After evaporating the source/drain electrodes upon the film, the devices showed a maximum mobility of 0.42 cm$^2$/V·sec, with an average mobility of 0.28 cm$^2$/V·sec from 10 transistors.

Comparative Example 2

In this comparative example, chlorobenzene was used as the solvent. The devices were fabricated using a similar procedure as described above.

The semiconducting polymer was soluble in chlorobenzene only at an elevated temperature. When the solution was cooled down to room temperature, precipitation was observed. After evaporating the electrodes upon the film, the devices were measured to have a maximum mobility of 0.26 cm$^2$/V·sec and an average mobility of 0.21 cm$^2$/V·sec.

Comparative Example 3

In this comparative example, 1,2-dichlorobenzene was used as the solvent. The devices were fabricated using a similar procedure as described above.

A 0.3 wt % concentration of polymer in solvent was used. However, Polymer A was only soluble in warm dichlorobenzene solvent. Once the solution was cooled down to room temperature, the polymer precipitated. After evaporating the electrodes upon the semiconductor film, the devices were measured to have a maximum mobility of 0.28 cm$^2$/V·sec and an average mobility of 0.23 cm$^2$/V·sec.

Comparative Example 4

In this comparative example, chlorotoluene was used as the solvent. The polymer could not be dissolved completely in the solvent, even at 0.3 wt % concentration and at elevated temperatures.

Comparison

Table 2 summarizes the examples and their results.

TABLE 2

| Example | Solvent | Max. mobility cm$^2$/V · sec | Avg. mobility cm$^2$/V · sec |
|---|---|---|---|
| Ex. 2 | 1,1,2,2,-tetrachloroethane | 0.87 | 0.65 |
| Comp. Ex. 1 | Chloroform | 0.42 | 0.28 |
| Comp. Ex. 2 | Chlorobenzene | 0.26 | 0.21 |
| Comp. Ex. 3 | 1,2-Dichlorobenzene | 0.28 | 0.23 |
| Comp. Ex. 4 | 1-chlorotoluene | NA | NA |

Comparative Examples 2-4 used aromatic halogenated hydrocarbon solvents. The mobility here was about one-quarter that obtained by Example 2.

Comparative Example 1 contained one carbon atom and three halogen atoms. However, the obtained mobility was less than half that of Example 2, whose solvent had two carbon atoms and four halogen atoms.

Example 3

A diketopyrrolopyrrole-thiophene copolymer of Formula (B) (referred to hereafter as Polymer B) was synthesized in the similar manner as Polymer A:

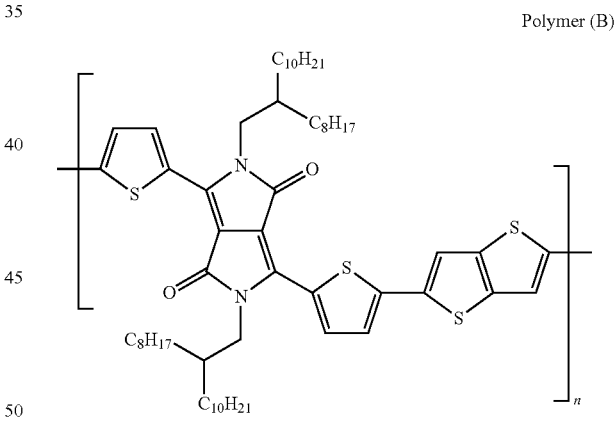

Polymer (B)

10 mg of Polymer B was dissolved in 2 grams of 1,1,2,2-tetrachloroethane solvent with the assistance of heat and shaking to form a dark blue solution. The solution (0.5 wt % Polymer B) was stable at room temperature for days without precipitation.

A silicon wafer was provided as a substrate for an electronic device. Heavily doped silicon was used as a gate electrode. A 200-nm thick silicon oxide layer served as the gate dielectric layer. The surface of the silicon oxide layer was modified with octyltrichlorosilane.

After being filtered with a 0.2 micron syringe filter, the solution was spin coated at 2000 rpm onto the silicon wafer. A very smooth and shiny semiconducting film was obtained. After drying and annealing in a vacuum oven at 150° C. for 10 minutes, gold source/drain electrodes were vapor evaporated on top of the semiconducting layer to form a series of transistors. At least 10 transistors were evaluated using a Keithley SCS4200 system at ambient conditions. The devices exhibited very a high current on/off ratio over 10$^7$, and the mobility was calculated to have a maximum value of 0.65 cm$^2$/V·sec. The transistors showed an average mobility of 0.52 cm$^2$/V·sec. In comparison, when o-dichlorobenzene and chloroform were used as the solvent for device fabrication. a maximum mobility of 0.20 and 0.25 cm$^2$/V·sec were obtained, respectively, which was less than half the average mobility of the devices using 1,1,2,2-tetrachloroethane as solvent.

The present disclosure has been described with reference to exemplary embodiments. Obviously, modifications and alterations will occur to others upon reading and understanding the preceding detailed description. It is intended that the present disclosure be construed as including all such modifications and alterations insofar as they come within the scope of the appended claims or the equivalents thereof.

The invention claimed is:

1. A composition comprising:
   a non-aromatic halogenated hydrocarbon solvent selected from the group consisting of trichloroethylene and 1,1,2-trichloroethane; and
   a polymer of Formula (IV):

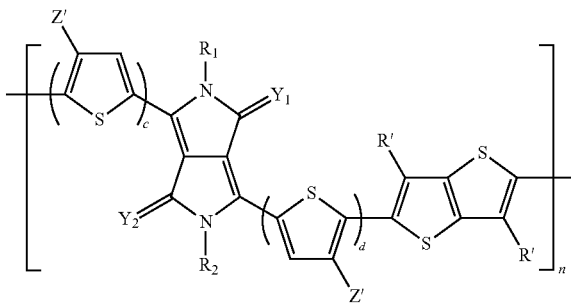

Formula (IV)

wherein R$_1$ and R$_2$ are independently hydrogen, alkyl, substituted alkyl, aryl, substituted aryl, heteroaryl, or substituted heteroaryl;
Y$_1$ and Y$_2$ are S or O;
each Z' and R' is independently hydrogen, alkyl, substituted alkyl, aryl, substituted aryl, heteroaryl, substituted heteroaryl, halogen, alkoxy, alkylthio, trialkylsilyl, —CN, or —NO$_2$;
c and d are independently 1 or 2; and
n is from 2 to about 5,000.

2. The composition of claim 1, wherein the polymer is from about 0.01 wt % to about 5 wt % of the composition.

3. The composition of claim 1, wherein R$_1$ and R$_2$ are alkyl.

4. The composition of claim 1, wherein Y$_1$ and Y$_2$ are both O or both S.

5. The composition of claim 1, wherein the average mobility of a semiconducting layer formed from the composition is at least 100% greater than the average mobility of a semiconducting layer formed from a composition containing the same polymer and a different hydrocarbon solvent containing 1 or 2 chlorine atoms.

6. The composition of claim 1, wherein the average mobility of a semiconducting layer formed from the composition is at least 0.5 cm$^2$V·sec.

7. A semiconductor composition comprising:
   a non-aromatic halogenated hydrocarbon solvent selected from the group consisting of trichloroethylene and 1,1,2-trichloroethane; and
   a polymer of Formula (21-A):

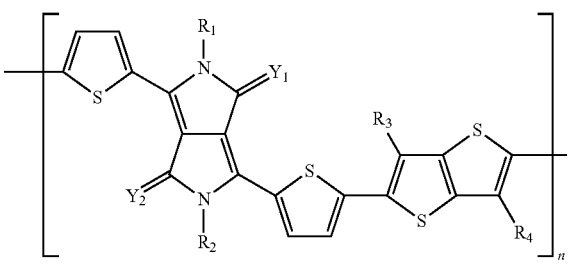

Formula (21-A)

wherein R$_1$ and R$_2$ are independently hydrogen, alkyl, substituted alkyl, aryl, substituted aryl, heteroaryl, or substituted heteroaryl;
Y$_1$ and Y$_2$ are independently S or O; and
R$_3$ and R$_4$ are independently hydrogen, alkyl, substituted alkyl, aryl, substituted aryl, heteroaryl, substituted heteroaryl, halogen, alkoxy, alkylthio, trialkylsilyl, —CN, or —NO$_2$.

8. An electronic device comprising a semiconducting layer, wherein the semiconducting layer is formed from a semiconductor composition comprising:
   a non-aromatic halogenated hydrocarbon solvent selected from the group consisting of trichloroethylene and 1,1,2-trichloroethane; and
   a polymer of Formula (IV):

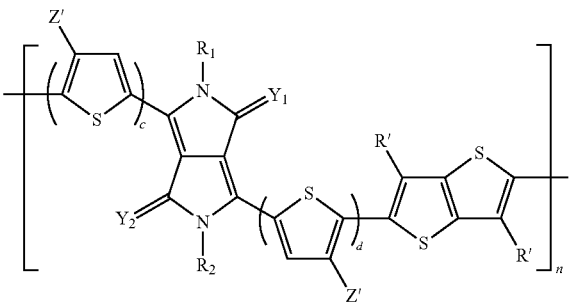

Formula (IV)

wherein R$_1$ and R$_2$ are independently hydrogen, alkyl, substituted alkyl, aryl, substituted aryl, heteroaryl, or substituted heteroaryl;
Y$_1$ and Y$_2$ are S or O;
each Z' and R' is independently hydrogen, alkyl, substituted alkyl, aryl, substituted aryl, heteroaryl, substituted heteroaryl, halogen, alkoxy, alkylthio, trialkylsilyl, —CN, or —NO$_2$;
c and d are independently 1 or 2; and
n is from 2 to about 5,000; and
   wherein the average mobility of the semiconducting layer is at least 100% greater than the average mobility of a semiconducting layer formed from a semiconductor composition containing the same polymer and a different hydrocarbon solvent containing 1 or 2 chlorine atoms.

9. The composition of claim 1, wherein the polymer has the structure of Formula (21):

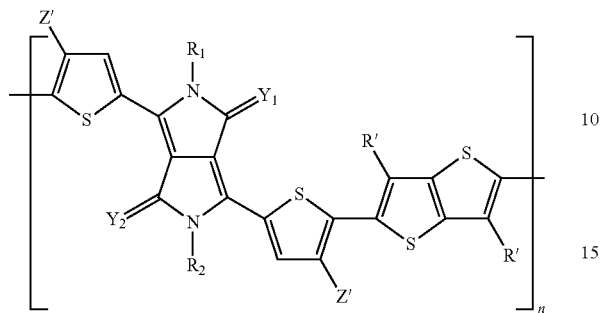

Formula (21)

wherein $R_1$ and $R_2$ are independently hydrogen, alkyl, substituted alkyl, aryl, substituted aryl, heteroaryl, or substituted heteroaryl;

$Y_1$ and $Y_2$ are independently S or O; and each Z' is independently hydrogen, alkyl, substituted alkyl, aryl, substituted aryl, heteroaryl, substituted heteroaryl, halogen, alkoxy, alkylthio, trialkylsilyl, —CN, or —NO$_2$.

10. The composition of claim 1, wherein $Y_1$ and $Y_2$ are both S.

* * * * *